United States Patent [19]
Nakagawa

[11] Patent Number: 5,309,198
[45] Date of Patent: May 3, 1994

[54] LIGHT EXPOSURE SYSTEM
[75] Inventor: Masahiro Nakagawa, Yokohama, Japan
[73] Assignee: Nikon Corporation, Tokyo, Japan
[21] Appl. No.: 18,545
[22] Filed: Feb. 17, 1993
[30] Foreign Application Priority Data Feb. 25, 1992 [JP] Japan .................. 4-73488
Jun. 2, 1992 [JP] Japan .................. 4-166962

[51] Int. Cl.$^5$ ............................ G03B 27/54
[52] U.S. Cl. ........................ 355/67; 355/53
[58] Field of Search ............ 355/53, 67, 71, 68; 353/122; 362/268; 359/619, 628

[56] References Cited
U.S. PATENT DOCUMENTS

| | | | |
|---|---|---|---|
| 4,497,015 | 1/1985 | Konno et al. | 362/268 |
| 4,619,508 | 10/1986 | Shibuya | 353/122 |
| 4,780,747 | 10/1988 | Suzuki et al. | 355/68 |
| 4,851,978 | 7/1989 | Ichihara | 362/268 |
| 4,939,630 | 7/1990 | Kikuchi et al. | 362/268 |
| 5,097,291 | 3/1992 | Suzuki | 355/69 |
| 5,153,773 | 10/1992 | Muraki et al. | 359/619 |
| 5,237,367 | 8/1993 | Kudo | 355/67 |
| 5,245,384 | 9/1993 | Mori | 355/67 |
| 5,251,067 | 10/1993 | Kamon | 359/628 |

Primary Examiner—Richard A. Wintercorn
Attorney, Agent, or Firm—Shapiro and Shapiro

[57] ABSTRACT

A light exposure system is for exposure of a pattern on a first object to form an image thereof on a second object, which comprises an illumination optical system for illuminating the first object, a projection optical system for projecting the pattern on the first object onto the second object, a stage device for two-dimensionally moving the second object while holding the second object, a reference member mounted on the stage device, a detecting device for detecting light from the reference member, and a measuring device for carrying out a predetermined measurement, based on an output of the detecting device. In the light exposure system, the illumination optical system comprises a light source device for supplying exposure light, an off-center multiple beam producing device for producing from the exposure light from the light source device a plurality of light sources eccentric to an optical axis of the illumination optical system, and a light condensing optical system for condensing a plurality of beams from the off-center multiple beam producing device to illuminate the first object in an oblique direction. Further in the system, the detecting device is disposed at a position where the plurality of eccentric beams are formed by the off-center multiple beam producing device and on the optical axis of the illumination optical system to receive the light from the reference member through the projection optical system and the light condensing optical system.

20 Claims, 11 Drawing Sheets

LIGHT EXPOSURE SYSTEM

BACKGROUND OF THE INVENTION

1. Field of the Invention

The present invention relates to a light exposure system suitable for production of semiconductors, and more particularly, to a light exposure system provided with an oblique illumination optical system illuminating in an oblique direction a projection original plate on which a circuit pattern or the like is formed.

2. Related Background Art

First prior art

Semiconductor integrated circuits have been increasing the degree of integration these days so that a minimum line width in a circuit comes to be of submicron order. With the increase of integration degree, projection exposure systems for producing semiconductor integrated circuits in the photolithography process are now required to have a higher resolution and a higher alignment accuracy. Positioning or alignment includes wafer alignment for aligning a position to be exposed for each shot on a wafer with a position where an image of a pattern of a reticle is projected to form an image thereto on the wafer, and reticle alignment for maintaining a positional relation in a certain state between the reticle and a stage upon exchange of reticle.

FIG. 6 shows a projection exposure system provided with a measurement optical system for performing the conventional reticle alignment. In FIG. 6, reference numeral 1 designates a light source such as a mercury lamp. Exposure light IL radiated from the light source 1 is condensed by an elliptic mirror 2 and then reflected by a bending mirror 3. Then, the light IL passes through an input lens 4 to become a parallel beam. The parallel beam enters an optical integrator 5 composed of a fly eye lens. A shutter 6 is located at the vicinity of the secondary focus of the elliptic mirror 2. The exposure light IL may be intercepted on demand by rotating the shutter 6 through a drive motor 7.

When the exposure light IL is intercepted by the shutter 6, the exposure light IL is reflected by the shutter 6 in a direction substantially normal to the optical axis of the elliptic mirror 2. The thus-reflected exposure light IL is made by a condenser lens 8 to enter an end of a light guide 9. The exposure light IL radiated from the light source IL enters either the optical integrator 5 or the light guide 9, accordingly.

When the exposure light IL enters the optical integrator 5, numerous secondary light source images, as will be hereinafter referred to as "secondary light source", are formed on a focal plane of the optical integrator 5 on the reticle side. A variable aperture stop 10 is positioned at the secondary light source formation plane. The exposure light emitted from the secondary light source passes through a half mirror 11 inclined at 45 degrees to the optical axis of the exposure light. Then the exposure light passes through a first condenser lens 12, a bending mirror 13, and a second condenser lens 14 then to illuminate at a uniform illuminance a pattern area on the lower surface of a reticle R.

In FIG. 6, PL represents a double side (or one side) telecentric projection optical system and 17 does a wafer stage. A wafer W is placed in a wafer holder on the wafer stage 17. The wafer stage 17 is comprised of an X-Y stage, which can two-dimensionally move in a plane normal to the optical axis of the projection optical system PL, and a Z stage, which can move in the direction of the optical axis of the projection optical system PL. An image of the pattern on the reticle R is formed by the projection optical system PL on the wafer W during exposure. In this arrangement, the secondary light source formation plane of the optical integrator 5 is conjugate with a pupil plane of the projection optical system PL. The $\sigma$ value, which represents the coherency of the illumination optical system illuminating the reticle R, may be changed by adjusting an aperture of the variable aperture stop 10 located at the secondary light source formation plane. Defining the maximum incident angle of the exposure light IL illuminating the reticle R as $\theta_{IL}$ and a half angular aperture of the projection optical system PL on the side of the reticle R as $\theta_{PL}$, the $\sigma$ value may be expressed by $\sin \theta_{IL} / \sin \theta_{PL}$. The $\sigma$ value is set at about 0.3 to 0.6 in general.

An adjustment plate 19, which is a glass plate for example, is fixed near the wafer holder on the wafer stage 17. A reference pattern is formed on a plane of the adjustment plate 19 on the side of the projection optical system PL. Corresponding to the reference pattern, a reticle mark RM is formed in an image field of the projection optical system and in the proximity of the pattern area on the reticle R at a position where the reticle mark is conjugate with the reference pattern on the adjustment plate 19 with respect to the projection optical system PL. For example, the reference pattern on the adjustment plate 19 may be a cross aperture pattern formed in a light shielding surface, while the reticle mark RM on the wafer W may be a pattern obtained by multiplying the reference pattern by a projection magnification of the projection optical system PL and then reversing bright and dark portions in the pattern.

There are a condenser lens 21 and a bending mirror 20 placed below the adjustment plate 19 of the wafer stage 17. The other end of the light guide 9 is fixed at the rear focal plane of the condenser lens 21. A surface of the other end of the light guide 9 is conjugate with a pupil plane of the projection optical system PL, and, therefore, with the variable aperture stop 10. A light emission plane of the other end of the light guide 9 is so sized as to provide a projection image onto the variable aperture stop 10, which is substantially equal to the aperture of the variable aperture stop 10. In this arrangement, the emission plane illuminates the reference pattern on the adjustment plate 19 with an illumination $\sigma$ value almost equal to that for exposure light IL. Further, in the illumination optical system for exposure light IL, a light receiving portion of a photomultiplier 22 is located at a position conjugate with the variable aperture stop 10 with respect to the half mirror 11. Namely, the light receiving portion of the photomultiplier 22 is positioned in a plane conjugate with the pupil plane of the projection optical system PL and with the emission plane of the other end of the light guide 9. A detection surface in the light receiving portion is larger than an image of the light emission plane of the other end of the light guide 9 projected thereon, whereby preventing a loss in quantity of light. Consequently, when the reference pattern of the adjustment plate 19 is illuminated from the bottom side, most of light emitted through the reference pattern of the adjustment plate 19 enters the projection optical system PL and then reaches through the reticle mark RM on the reticle R to the light receiving surface of the photomultiplier 22 no matter where the adjustment plate 19 is situated in the image field of the projection optical system PL.

In FIG. 6, numeral 23 denotes a central processing unit (CPU) for controlling an operation for reticle alignment. Photoelectrical conversion signals are output from the photomultiplier 22 to the CPU 23. There are an X direction mirror and an unrepresented Y direction mirror fixed on the upper surface of the wafer stage 17. A coordinate of a position may be always monitored on the wafer stage 17 by using a laser interferometer 24 and the two mirrors. Coordinate information of the wafer stage 17 is supplied from the laser interferometer 24 to the CPU 23, and the CPU 23 may move the wafer stage 17 through the stage driving unit 25 to a desired coordinate position.

In reticle alignment, the CPU 23 makes the shutter 6 intercept the exposure light IL through the drive motor 7 and makes the adjustment plate 19 on the wafer stage 17 move into the image field of the projection optical system PL through the stage driving unit 25. By this, the exposure light IL reflected by the shutter 6 passes through the condenser lens 8 and the light guide 9 to be emitted into the inside of the wafer stage 17. The exposure light thus emitted will be hereinafter referred to as illumination light. The illumination light is reflected by the bending mirror 20 and thereafter converted by the condenser lens 21 into a parallel beam to illuminate the reference pattern formed on the adjustment plate 19 from the bottom side thereof. A zeroth order beam directly transmitted through the reference pattern of the adjustment plate 19 and illumination light diffracted by the reference pattern are converged by the projection optical system PL at the position conjugate with the reference pattern on the reticle R to form projection images of the reference pattern there.

Out of the light beams forming the projection images of the reference pattern, beams of the illumination light having passed through a light transmissive area of the reticle mark RM on the reticle R pass through the second condenser lens 14, the bending mirror 13, the first condenser lens 12, and the half mirror 13 to enter the light receiving surface of the photomultiplier 22. The higher order diffracted light beams, out of the beams of the illumination light output from the reference pattern of the adjustment plate 19 toward the projection optical system PL, are slant at large angles to the optical axis of the second condenser lens 14 when passing through the reticle mark RM of the reticle R. Consequently, most of the higher order diffracted light beams from the adjustment plate 19 do not reach the light receiving surface of the photomultiplier 22. However, the light intensity of the higher order diffracted light is very low. Therefore, as far as the adjustment plate 19 is present in the image field of the projection optical system PL, most of the illumination light from the adjustment plate 19 enters the light receiving surface of the photomultiplier, whereby the SN ratio of the photoelectric conversion signals is high enough.

The CPU 23 controls the stage driving unit 25 to scan the wafer stage 17 by the laser interferometer 24 in a plane normal to the optical axis of the projection optical system PL while monitoring coordinate information thereof. When the projection image of the reference pattern of the adjustment plate 19 on the wafer stage 17 is superimposed on the reticle mark RM, which has the pattern with inverted bright and dark portions to the reference pattern, the minimum output is obtained in a photoelectric conversion signal of the photomultiplier 22 supplied to the CPU 23. Therefore, a coordinate of the stage where the minimum output is obtained in the photoelectric conversion signal corresponds to the position where the projection image of the reference pattern of the adjustment plate 19 is superimposed on the reticle mark RM on the bottom surface of the reticle R. Then, measuring stage coordinate values of crosses RM disposed at at least two positions near the pattern area of the reticle R, a coordinate of the center position and a rotation angle of the projection image of the reticle R projected onto the upper surface of the wafer stage 17 may be measured at high accuracy. For example, the reticle R is finely moved by the reticle driving mechanism (not shown) under control of the CPU 23 in the plane normal to the optical axis of the projection optical system PL, and the center position and the rotation angle in the horizontal plane of the projection image of the reticle R are set on the upper surface of the wafer stage 17 in desired conditions, whereby effecting the alignment of the reticle R.

Next explained with reference to FIG. 7A and FIG. 7B is the fundamental structure of the conventional illumination optical system for exposure light IL. FIG. 7A simplifies the main part of the illumination optical system of the projection exposure system as shown in FIG. 6. In FIG. 7A reference numeral 26 designates a condenser lens, and the exposure light passes through the optical integrator 5 comprised of the fly eye lens, the variable aperture stop 10, and the condenser lens 26 to illuminate the pattern 15a on the reticle R. The variable aperture stop 10 is located at the reticle side focal plane P1 of the optical integrator 5, that is, at or near the Fourier transform plane to the pattern 15a of the reticle, and has an aperture 10a of substantial circle with the center at the optical axis AX of the projection optical system PL, as shown in FIG. 7B. The variable aperture stop 10 defines a circular circumference of the numerous images in the secondary light source formed on the reticle side focal plane P1.

A part of the exposure light with a wavelength $\lambda$ illuminating the reticle R is diffracted by the pattern 15a of the reticle R, and a zeroth order light beam $D_o$, a positive (+) first order diffracted light beam $D_p$, and a negative (−) first order diffracted light beam $D_m$ are incident from the pattern 15a into the projection optical system PL. These zeroth order light beam and ± first order diffracted light beams are condensed by the projection optical system PL onto the wafer W to form interference fringes on the wafer W. In this case, defining the pupil plane of the projection optical system PL as P2, the higher order diffracted light beams become apart from the optical axis on the pupil plane P2 with an increase of the order. If at least ± first order light beams could pass through the pupil plane P2, a pattern would be formed on the wafer W at a pitch obtained by multiplying a pitch P of the pattern 15a of the reticle R by the projection magnification. When a numerical aperture of the projection optical system PL on the side of the reticle R is defined as $NA_R$, the minimum resolution limit of the pattern 15a of the reticle R, which can be resolved by the projection optical system PL, is $\lambda/NA_R$.

The minimum pattern size is a half of the minimum pitch P, that is, $0.5 \cdot \lambda/NA_R$. In an actual application, influences should be considered for example from the wafer warp and the photo resist in photolithography process. A practical minimum pattern size on the reticle R is $k \cdot \lambda/NA_R$, where k is a process factor of about 0.6 to 0.8. Further, when the numerical aperture of the projection optical system PL on the side of the wafer W is defined as $NA_W$, a depth of focus of the projection optical system PL is represented by $\pm\lambda/\{2(NA_W)^2\}$, and there stands such a relation that $NA_W=NA_R/\beta$, where $\beta$ is an imaging magnification (reduction ratio) of the projection optical system PL. Accordingly, as the numerical aperture of the projection optical system PL is increased in order to decrease the minimum pattern size on the reticle, the depth of focus becomes shallower in proportion to the inverse square of the numerical aperture.

It is a recent need that a reticle pattern with a further smaller pattern size be replicated on a wafer in order to obtain a semiconductor integrated circuit further highly integrated. There is, however, a disadvantage of a too shallow depth of focus resulted, if the minimum pattern size is reduced by increasing the numerical aperture of the projection optical system 16 in the illumination method in which the reticle R is illuminated through the condenser lens 26 with the exposure light from the secondary light source formed by the optical integrator 5 disposed on the optical axis as shown in FIG. 7A.

There is so-called plural oblique illumination proposed as shown in FIG. 8 as an illumination method for high resolution, by which the minimum pattern size may be made smaller with an acceptable reduction of the depth of focus. In FIG. 8, reference numerals 29a and 29b represent a first group of fly eye lenses (first optical integrators), and 27a and 27b a second group of fly eye lenses (second optical integrators) placed along an extension of the first group of fly eye lenses so that the second group of fly eye lenses 27a and 27b are illuminated by the exposure light emitted from the light source IL.

The exposure light beams output from the second group of fly eye lenses 27a and 27b are condensed by the guide optical systems 28a and 28b, respectively, then to uniformly illuminate the first group of fly eye lenses 29a and 29b. Variable aperture stops 30a and 30b are positioned on the reticle side focal plane P1 of the first group of fly eye lenses 29a and 29b, respectively. The variable aperture stops 30a and 30b define outer diameters of secondary light sources formed on the reticle side focal plane P1 of the first group of fly eye lenses 29a and 29b. The exposure light output from the variable aperture stops 30a and 30b uniformly illuminates the pattern 15a of the reticle R through the condenser lens 26. Since the first and second groups of fly eye lenses make the illuminance distribution uniform, uniformity of the illuminance distribution of the exposure light becomes remarkably excellent on the reticle R.

In this arrangement, the variable aperture stops 30a and 30b are disposed on the object side focal plane of the condenser lens 26, the reticle R is located on the image side focal plane of the condenser lens 26, and the secondary light source formation plane P1 is conjugate with the pupil plane P2 of the projection optical system PL. The exposure light output from the variable aperture stop 30a is refracted by the condenser lens 26 such that a ray leaving the center of the variable aperture stop (as will be referred to as "principal ray") enters the reticle R as inclined at an angle $\phi(0<\phi<\pi/2)$ in the clockwise direction with respect to the optical axis AX of the projection optical system PL. In contrast, the exposure light output from the variable aperture stop 30b is refracted by the condenser lens 26 such that a principal ray enters the reticle R as inclined at an angle $\phi$ in the counterclockwise direction with respect to the optical axis AX of the projection optical system PL.

Supposing the reticle pattern 15a has a grating pattern formed at a predetermined pitch P in a direction parallel to the sheet plane of FIG. 8 and when the exposure light output from the variable aperture stop 30a is incident into the reticle pattern 15a, the zeroth order beam $D_o$ goes out thereof toward the projection optical system PL in the same direction as the incident light. The + first order diffracted light beam $D_p$ goes out in a direction which is inclined at an angle of $(\theta_p+\phi)$ in the clockwise direction to the optical axis AX, while the — first order diffracted light beam $D_m$ goes out in a direction which is inclined at an angle of $(\theta_m-\phi)$ in the counterclockwise direction to the optical axis AX. These diffraction angles $\theta_p$ and $\theta_m$ may be expressed by the following equations.

$$\sin(\theta_p+\phi)-\sin\phi=\lambda/P \tag{1}$$

$$\sin(\theta_m-\phi)+\sin\phi=\lambda/P \tag{2}$$

As the reticle pattern 15a becomes finer, the + first order diffracted light beam $D_p$, which is output in the direction inclined by the angle $(\theta_p+\phi)$, comes to fail to pass through the aperture stop on the pupil plane P2 of the projection optical system PL. In such a case, however, the — first order diffracted light beam $D_m$ may pass through the aperture stop of the projection optical system PL. Then, there are interference fringes made by the two beams of the zeroth order light beam $D_o$ and the — first order diffracted light beam $D_m$ on the wafer W. The interference fringes show an image of the reticle pattern 15a. If the reticle pattern 15a has a line and space pattern of 1:1, an image of the reticle pattern 15a is formed at a contrast of about 90% on a resist coating on the wafer W.

In this case, a resolution limit is set when following condition is established.

$$\sin(\theta_m-\phi)=NA_R \tag{3}$$

Putting the equation (3) into the equation (2), the following relation stands with the pitch P of the minimum pattern which can be replicated, on the reticle side.

$$NA_R+\sin\phi=\lambda/P$$

Arranging the above relation, the pitch P of the minimum pattern is obtained as follows.

$$P=\lambda/(NA_R+\sin\phi) \tag{4}$$

For example, if the numerical aperture, $\sin\phi$, for the inclination angle $\phi$ of the exposure light illuminating the reticle R is set to $0.5\times NA_R$, the pitch P of the minimum pattern is obtained as follows.

$$P=\lambda/(NA_R+0.5NA_R)=2\lambda/(3NA_R) \tag{5}$$

Comparing to the resolution limit of $\lambda/NA_R$ in the illumination method of FIGS. 7A and 7B, the illumination method of FIG. 8 can provide a higher resolution as shown.

The following discussion is about the depth of focus. If a deviation amount (defocus amount) of the wafer W from the focus position of the projection optical system PL is $\Delta F$ and an incidence angle at which the zeroth order beam or a diffracted beam is incident at a point on the wafer W is $\theta_D$, the wavefront aberration due to the defocus is given by $\Delta F \cdot \sin^2 \theta_D/2$. In this aberration, sin $\theta_D$ represents a distance of the diffracted light to the optical axis AX on the pupil plane P2 of the projection optical system PL. In the conventional illumination method as shown in FIGS. 7A and 7B, sin $\theta_D=0$ for the zeroth order light beam $D_o$. On the other hand, sin $\theta_D=M\cdot\lambda/P$ for the $\pm$ first order diffracted light beams $D_p$, $D_m$, where M is the magnification (enlargement ratio) of the projection optical system. Therefore, the wavefront aberration due to the defocus with the zeroth order light $D_o$ and the $\pm$ first order diffracted light beams $D_p$, $D_m$ is $\Delta F \cdot M^2(\lambda/P)^2/2$.

In contrast, sin $\theta_D=M\cdot\sin\phi$ in the illumination method of FIG. 8, since the zeroth order beam $D_o$ is inclined at the angle $\phi$ to the optical axis AX. As for the—first order diffracted light beam $D_m$, sin $\theta_D=M\cdot\sin(\theta_m-\phi)$. In this case, if the diffraction angle $\theta_m$ is about $2\phi$, sin $\phi \simeq \sin(\theta_m-\phi)$, whereby the relative wavefront aberration due to the defocus becomes almost equal to 0 between the zeroth order light beam $D_o$ and the—first order diffracted light beam $D_m$. Then, even if the wafer W is slightly deviated in the direction of the optical axis from the focus position, the image of the reticle pattern 15a is not affected so much as to the focus condition thereof as compared to the conventional method, resulting in enlarging the depth of focus. In order to set the diffraction angle $\theta_m$ to $2\phi$, the incident angle $\phi$ of the exposure light into the reticle R should be set to satisfy the relation sin $\phi=\lambda/(2P)$, as seen from the equation (2). By this, the depth of focus may be greatly increased.

Problems in the first prior art

In the plural oblique illumination as shown in FIG. 8, the $\sigma$ value is for example about 0.2 for the exposure light output from each of the fly eye lenses 29a and 29b, but the process is substantially equivalent to what the condenser lens 26 processes the exposure light from a light source having a circular circumference circumscribing the fly eye lenses 29a and 29b. Thus, the condenser lens 26 has to illuminate the reticle R with an illumination beam having a large $\sigma$ value for example of about 1, and the requirements accuracy thereof has been increasing higher and higher these days. In detail, the condenser lens 26 has to be designed to have improved illuminance uniformity and illumination telecentricity by using a beam having a large $\sigma$ value, which forces a great load on the design of such a condenser lens.

In addition, in order to provide the exposure system with the measurement optical system for reticle alignment, the half mirror 11 must be located between the condenser lens, which is the condenser lens 12 or 14 in the example of FIG. 6, and the optical integrator (or the variable aperture stop), as shown in FIG. 6. However, if a beam for reticle position measurement is taken out by placing a half mirror in an optical axis between the condenser lens 26 and the optical integrator or the variable aperture stop, as being the case in the conventional method, in the illumination method as shown in FIG. 8, the condenser lens 26 would be doubled in outer diameter as compared to that in the conventional method, which disadvantageously increases difficulties in designing and in production.

Further, if the half mirror 11 is placed between the condenser lens 12 and the optical integrator 5 as shown in FIG. 6, the throughput is extremely lowered with a decrease in power of the exposure light due to a loss in quantity of light. If the reflectance of the half mirror 11 is restricted in order to solve the problem of the light quantity loss, the detection accuracy would be greatly lowered with a decrease of receiving light quantity of the detection system such as the photomultiplier 22. Moreover, a flare could be caused depending upon the arrangement of the half mirror 11, which results in illuminance unevenness on the wafer and measurement errors in reticle alignment.

A so-called annular zone illumination method, in which the reticle is illuminated by a secondary light source formed in annular zone by the optical integrator, may be also employed to illuminate the reticle in the oblique direction in the same manner as in the above plural oblique illumination method, while improving the resolution and the depth of focus of the projection optical system.

In the annular zone illumination method, the reticle is obliquely illuminated in the same manner as in the plural oblique illumination method. The annular zone illumination method could be considered as one of the oblique illumination methods, and, therefore, the annular zone illumination method and the plural oblique illumination method will be hereinafter generally referred to as an oblique illumination method.

However, if the half mirror 11 is placed between the condenser lens 12 and the optical integrator 5 as shown in FIG. 6, there would be problems caused in designing and in production of the condenser lens 26 as well as problems of illuminance unevenness due to the light quantity loss, the flare, and the like and of measurement errors, similarly as described.

Second prior art

A reduction projection exposure system is used to replicate a pattern of a reticle through a projection optical system onto a wafer in production of semiconductor devices or liquid crystal display devices with use of the photolithography technique. One of important properties of such a projection exposure system is the overlay accuracy. A main factor giving an influence to the overlay accuracy is a magnification error of the projection optical system. A line width in a pattern, which is used for very large scale integrated circuit (VLSI) for example, becomes finer and finer with years, and a need to improve the overlay accuracy on the wafer becomes greater accordingly. There is then another need for keeping the projection magnification of the projection optical system within a certain range.

It is known that the projection magnification of the projection optical system fluctuates in the vicinity of a desired magnification because of a slight temperature change in the system, a slight pressure change in atmosphere in a clean room, a temperature change of atmosphere, and irradiation hysteresis of exposure light on the projection optical system. Some of conventional projection exposure systems have a magnification correction mechanism for finely adjusting the magnification of the projection optical system to obtain a desired magnification. Examples of such a magnification correction mechanism are a mechanism for changing a certain lens gap in the projection optical system and a mechanism for adjusting a pressure in an air chamber in the projection optical system.

A position of best imagery plane (focal plane) of the projection optical system and the distortion condition also change due to the same changing factors as those in magnification. There are projection exposure systems provided with a focusing correction mechanism and/or with a distortion correction mechanism as well as with the magnification correction mechanism. For example, the distortion condition of the projection optical system may be adjusted to some extent by slightly inclining the reticle with respect to a plane normal to the optical axis of the projection optical system.

FIG. 12 shows a simplified structure of a conventional projection exposure system provided with a control mechanism of imaging characteristic of the projection optical system. In FIG. 12, reference numeral 101 designates a mercury lamp. Exposure light IL emitted from the mercury lamp 101 is converged by an elliptic mirror 102, and is then reflected by a mirror 103 to enter an input lens 104. The exposure light IL is converted by the input lens 104 into a substantially parallel beam. There is a shutter 106 disposed between the elliptic mirror 102 and the mirror 103. The supply of the exposure light IL to the input lens 104 may be stopped by closing the shutter 106 through a drive motor 107. Numeral 108 denotes a main control system for controlling operations of the entire system, which controls the operation of the drive motor 107. A pulse laser source such as KrF excimer laser or another light source may be employed in place of the mercury lamp 101.

The exposure light IL output from the input lens 104 enters a fly eye lens 105 as an optical integrator, and numerous images are formed as a secondary light source on a focal plane of the fly eye lens 105 on the output side (on the reticle R side). An aperture stop 109 is located at the secondary light source formation plane.

The exposure light IL output from an aperture portion of the aperture stop 109, that is, from the secondary light source, is directed to a beam splitter 110 having a high transmittance but a low reflectance. The exposure light IL 1 reflected by the beam splitter 110 enters a light receiving surface of an integrated exposure amount monitor 111 comprised of a photoelectric converter. A detection signal of the integrated exposure amount monitor 111 is supplied to the main control system 108. The main control system 108 calculates an integrated exposure energy by multiplying the integration value of the detection signal by a certain factor. The exposure light IL having passed through the beam splitter 110 passes through a first relay lens 112, a variable reticle blind 113, a second relay lens 114, and a mirror 115 to enter a main condenser lens 116. The exposure light IL is moderately converged by the main condenser lens 116 to illuminate the reticle R at a substantially uniform illuminance. In this arrangement, the variable reticle blind 113 is located on a plane conjugate with the reticle R and functions as an illumination field stop of the exposure light IL to the reticle R. The main control system 108 controls a drive unit 117 to set a shape of an aperture portion of the variable reticle blind 113 in a certain state.

The exposure light IL having passed through a pattern area on the reticle R is converged on a shot area on a wafer W through the projection optical system PL, whereby a pattern of the reticle R is replicated at a predetermined reduction magnification on the shot area on the wafer W. A Fourier transform plane (pupil plane) of the projection optical system PL is conjugate with the secondary light source formation plane of the fly eye lens 105. Further, the wafer W is held on a Z stage 118, and the Z stage 118 is mounted on an X-Y stage 119. The X-Y stage 119 may two-dimensionally position the wafer W in a plane normal to the optical axis of the projection optical system PL, and the Z stage 118 may position the wafer W in a direction parallel to the optical axis of the projection optical system PL. The main control system 108 controls the operations of the X-Y stage 119 and the Z stage 118 through a control unit 120.

In FIG. 12, numeral 121 denotes an irradiation optical system of a focus detection system, and 122 a light receiving optical system of the focus detection system. The irradiation optical system 121 obliquely projects an image for example of a slit pattern onto an object on the Z stage 118 in an exposure area of the projection optical system PL, and the light receiving optical system 122 receives the image of the slit pattern for example on a vibrating slit plate therein. A photoelectric detector is placed behind the vibrating slit plate. An output signal of the photoelectric detector is subject to synchronous rectification with a drive signal of the vibrating slit plate to obtain a focus detection signal. The thus-obtained focus detection signal is supplied to the main control system 108. The main control system 108 adjusts a height of the Z stage 118 as to keep the focus detection signal at a predetermined level, so that a surface of the object on the Z stage 118 is aligned with the best imagery plane of the projection optical system PL. There is a mechanism for offset adjustment of the focus detection signal, for example, a parallel flat glass an inclination angle of which can be adjusted, provided inside the light receiving optical system 122.

There are an irradiation amount monitor 123 comprised of a photoelectric conversion device, and a reference reflection plate 124 providing a reference for reflectance disposed in the vicinity of the wafer W on the Z stage 118. An irradiation power of the exposure light IL through the projection optical system PL may be measured by moving the X-Y stage 119 to set the irradiation amount monitor 123 in the exposure area of the projection optical system PL. A detection signal of the irradiation amount monitor 123 is supplied through a signal line not shown to the main control system 108.

Numeral 125 represents a characteristic control unit, which adjusts a certain pressure in an air chamber inside the projection optical system PL or which adjusts a certain gap between lenses forming the projection optical system PL. The imaging characteristic such as the projection magnification of the projection optical system PL may be adjusted within a certain range by adjusting the pressure in the air chamber or by adjusting the gap between lenses. The characteristic control unit 125 may further comprise a mechanism for slightly inclining the reticle R to a plane normal to the optical axis of the projection optical system PL. The main control system 108 sets the imaging characteristic such as the projection magnification of the projection optical system PL in a certain state through the characteristic control unit 125, depending upon integrated exposure amount of the exposure light and the reflectance of the wafer W.

The characteristic control unit 125 may control an operation of an offset adjustment mechanism of the focus detection signal in the light receiving optical system 122 of the focus detection system. When it is presumed that the position of the best imagery plane of the projection optical system PL is changed, the main control system 108 adjusts the offset of the focus detection signal of the light receiving optical system 122 through the characteristic control unit 125. By this, the exposure surface on the wafer W is always set on the best imagery plane of the projection optical system PL.

Further, though omitted in FIG. 12, there is a measuring apparatus is provided for measuring a pressure and a temperature around the projection optical system PL. Information about the pressure and the temperature obtained by the measuring apparatus is supplied to the main control system 108.

The exposure light reflected by the wafer W passes through the projection optical system PL, the reticle R, the main condenser lens 116, the mirror 115, the second relay lens 114, the variable reticle blind 113, and the first relay lens 112 to return to the beam splitter 110. The exposure light IL 2 reflected by the beam splitter 110 enters the light receiving surface of the reflectance monitor 126 composed of the photoelectric conversion device. A detection signal detected by the reflectance monitor 126 is supplied to the main control system 108. The main control system 108 moves the X-Y stage 119 through the drive unit 120 to sequentially set the wafer W and the reference reflection plate 124 in the exposure area of the projection optical system PL, whereby detection signals of the reflectance monitor are obtained corresponding to the wafer W and the reference reflection plate 124. The reflectance of the wafer W may be obtained for example from a proportional relation by preliminarily storing the reflectance of the reference reflection plate 124. An example of the method for measuring the reflectance of the wafer W by means of the reflectance monitor 126 is disclosed in U.S. Pat. No. 4,780,747.

In the projection exposure system of FIG. 12, an ordinary secondary light source, light of which is distributed on a circle in a region including the optical axis of the illumination optical system, is used as the secondary light source of the exposure light. The $\sigma$ value representing a degree of coherency of the exposure light IL, which is a ratio of a radius of an image of the secondary light source on the pupil plane of the projection optical system to a radius of the aperture stop of the projection optical system PL, is fixed for example at about 0.5, because the line width of pattern on the reticle R to be replicated ha been comparatively wide heretofore. In this arrangement, a beam of the exposure light IL is comparatively fine immediately after the secondary light source defined by the aperture stop 109, and, therefore, the beam splitter 110 employed may be of a relatively small size, whereby a less load is forced on the structure of the illumination optical system.

Problems in the second prior art

However, as the pattern of the reticle R to be replicated becomes finer and finer these days, some exposure systems employ an illumination optical system having a larger $\sigma$ value than 0.5. There has also been developed a projection exposure system which can use a phase shift reticle and a normal reticle as the reticle R while switching therebetween. An illumination optical system in such an exposure system requires a mechanism for changing the $\sigma$ value in a comparatively wide range. Applicants have proposed the so-called plural oblique illumination method in which the resolution of the projection optical system can be increased while maintaining the depth of focus comparatively deep. In the plural oblique illumination, the secondary light source of the exposure light is formed for example by four modified secondary light sources eccentric to the optical axis of the illumination optical system and separate from each other, and the reticle is obliquely illuminated by the four secondary light sources for example in four directions.

In the plural oblique illumination method, since the four secondary light sources of the exposure light are distributed in a region apart from the optical axis of the illumination optical system, a circle circumscribing the entire secondary light sources has a large radius, whereby the substantial c value of the illumination optical system becomes approximately 1. With the $\sigma$ value of about 1, an outer diameter of the secondary light sources, corresponding to the opening of the aperture stop 109 in FIG. 12, increases, whereby increasing a diameter of beams of the exposure light output from the secondary light sources.

Further, as the pattern to be replicated becomes finer and finer, the requirements accuracy of illuminance uniformity of the exposure light illuminating the reticle R is required to be higher and higher and the requirements accuracy of illumination telecentricity, which is a degree of parallel of the exposure light, is also required to be higher. Under such circumstances, if a beam splitter for splitting the exposure light is placed between the optical integrator such as the fly eye lens and the lens system such as the relay lens, accuracies for other elements in the illumination optical system must be set extremely high enough to obtain a required imaging characteristic, or the number of necessary lenses is increased, whereby a hard load is forced on the designing and the production of the illumination optical system.

SUMMARY OF THE INVENTION

It is an object of the present invention to provide a light exposure system provided with an illumination optical system applying an illumination light beam in an oblique direction to an original plate to be projected (reticle or mask) with a circuit pattern or the like formed thereon, in which a detection system is located at an optimum position for a predetermined measurement (for example, measurement of reticle position, measurement of balance in light quantity of exposure light, measurement of reflectance of wafer, and so on) or for a predetermined correction (correction of light quantity balance of the exposure light, correction of optical properties of projection optical system, and so on), whereby the predetermined measurement or correction can be executed at a high accuracy while reducing a load on designing and production of the illumination optical system and achieving a compact design of the entire system.

Specifically, it is an object of the present invention to provide a light exposure system in which an illumination optical system includes a compact optical system which can perform at a high accuracy a certain measurement (for example, measurement of reticle position, measurement of balance of light quantity of exposure light, measurement of reflectance of wafer, and so on) or a predetermined correction (for example, correction of light quantity balance of exposure light, correction of optical properties of projection optical system, and so on) without a load on a condenser lens system in oblique illumination in which an original plate to be projected such as a reticle and a mask is illuminated in an oblique direction.

In one aspect according to the present invention to achieve the above object, a light exposure system comprises:

an illumination optical system for illuminating said first object;

a projection optical system for projecting the pattern on said first object onto said second object;

stage means for two-dimensionally moving said second object while holding said second object;

a reference member mounted on said stage means;

detecting means for detecting light from said reference member; and measuring means for carrying out a predetermined measurement, based on an output of said detecting means;

wherein said illumination optical system comprises:

light source means for supplying exposure light;

off-center multiple beam producing means for producing from the exposure light from said light source means a plurality of light sources eccentric to an optical axis of said illumination optical system; and a light condensing optical system for condensing a plurality of beams from said off-center multiple beam producing means to illuminate said first object in an oblique direction; and wherein said detecting means being disposed at a position where said plurality of the light sources are formed by said off-center multiple beam producing means and on said optical axis of the illumination optical system, and receiving the light from said reference member through said projection optical system and said light condensing optical system.

According to the present invention as described above, in the plural oblique illumination, the plural secondary light sources formed by the optical integrators (29a, 29b) as shown in FIG. 1 are positioned eccentric to the optical system of the illumination optical system, and there is, therefore, a space among the plural secondary light sources, including the optical axis of the illumination optical system. The present invention effectively utilizes the space, in which a photoelectric conversion device (22) is disposed. In this arrangement, the photoelectric conversion device (22) receives through the condenser lenses (35, 36) light having passed through a measurement mark RM of a mask (R), out of light incident from a reference pattern (19) as a reference member into a projection optical system (PL) in reticle alignment. A light receiving surface of the photoelectric conversion device is located at a position conjugate with a pupil plane of the projection optical system (16), so that the photoelectric conversion device (22) may receive light with sufficient light quantity even if the reference pattern (19) moves in an image field of the projection optical system (16).

In this arrangement, no additional optical member such as a half mirror is necessary between the condenser lenses (35, 36) and the plural secondary light sources. Then, even if the σ value of the illumination beams could become larger as a whole, the condenser lenses (35, 36) could be designed independent of others. Accordingly, the design and the production of the condenser lenses are easier than those in the arrangement using the half mirror. Further, since no half mirror is used, there is no loss in quantity of light and no influence of the flare which could be caused by the half mirror.

In case that the annular zone illumination method is employed with lens elements forming the optical integrator being set in the form of hollow cylinder to form a secondary light source of annular zone therewith, there is a vacant space (a space inside the optical integrator) on the optical axis of the secondary light source and a photoelectric conversion device is placed in the space to conduct measurement of reticle position.

In case that an aperture stop (space filter) having an annular opening is disposed on the side of an object to be illuminated before the optical integrator to form an annular secondary light source, there is also a vacant space in the center of the aperture stop and the photoelectric conversion device may be positioned in the space.

Further, a case that the optical integrators (29a, 29b) are composed of a plurality of fly eye lenses respectively provided at positions eccentric to the optical axis of the illumination optical system, as shown in FIG. 1, means a case of an illumination optical system employing the so-called plural oblique illumination method. In this case, the secondary light sources are formed in the proximity of the focal plane of the fly eye lenses (29a, 29b), respectively, on the reticle side. The photoelectric conversion device (22) may be located in the space between the plural fly eye lenses (29a and 29b) accordingly.

In case that the annular secondary light source is formed by such an arrangement that an aperture stop (space filter) having a plurality of openings eccentric to the optical axis is placed before the optical integrator on the side of an object to be illuminated to form the secondary light source eccentric to the optical axis, there is a vacant space in the central portion of the aperture stop and the photoelectric conversion device may be positioned in the space.

According to the present invention, the measurement of reticle position may be carried out by effectively using the space in the secondary light source formation plane given by the arrangement of the optical integrators, which is intrinsic in the so-called oblique illumination system or the space among the secondary light sources, which is intrinsic in the annular illumination method. There are advantages of more simplified structure of an optical system for reticle position measurement and of load reduction in designing and in production of the condenser lenses in the illumination optical system. Also, a dispersion of quantity of light incident into the wafer among beams of the secondary light sources may be measured at a high accuracy by receiving the diffracted beams advancing from the wafer stage along the optical axis of the projection optical system, in a simple structure by the photoelectric conversion element disposed in the space. Further, the reticle alignment may be carried out with the wafer mark WM and the reticle mark RM illuminated with the diffracted light.

In another aspect according to the present invention to achieve the above object, a light exposure system for exposure of a pattern on a first object to form an image thereof through a projection optical system on a second object, comprises:

light source means for supplying exposure light;

first optical means for forming from the light from said light source means a plurality of beams eccentric to an optical axis of said projection optical system;

second optical means for forming from light from said first optical means a plurality of beams eccentric to the optical axis of said projection optical system;

a light condensing optical system for condensing light from said second optical means to illuminate said first object in an oblique direction;

light splitting means for splitting the plurality of beams for exposure formed by said first optical means and for splitting light from said second object through said projection optical system and said light condensing optical system;

first detecting means for detecting said exposure light split by said light splitting means;

second detecting means for detecting the light from said second object split by said light splitting means; and controlling means for controlling an imaging characteristic of said projection optical system, based on outputs of said first and second detecting means.

According to the present invention, the first optical means (129A, 129B) form the secondary light sources, the second optical means (134A, 134B) form the tertiary light sources from the secondary light sources, and the exposure light from the tertiary light sources is condensed by the condenser optical system (116A) to illuminate the mask R. In such an arrangement, the plural oblique illumination is effected with the tertiary light sources formed from the secondary light sources, so that the illuminance uniformity may be further improved on the reticle R. A part of the exposure light directed from the first optical means to the second optical means is split by the beam splitting means (131A) to enter the first detecting means (132A). On the other hand, after reflected by a photosensitive substrate W, a part of reflected light directed from the second optical means to the first optical means is split by the beam splitting means (131A) to enter the second detecting means (140A).

In this arrangement, the first detecting means (132A) may be disposed on a plane substantially conjugate with the mask R (besides the photosensitive substrate W) and the second detecting means (140A) may be disposed on a plane substantially conjugate with the secondary light sources or the tertiary light sources. The first detecting means (132A) outputs a signal substantially proportional to an exposure amount of the exposure light to the mask R as an integrated exposure amount monitor, and the second detecting means (140A) outputs a signal corresponding to the reflectance of the photosensitive substrate W as a reflectance monitor.

Also, the beam splitting means (131A) is disposed by effectively using the space between the first optical means (129A, 129B) and the second optical means (134A, 134B), so that no beam splitter or the like is necessary for taking out the reflected light inside the main condenser optical system (116A). The load is reduced in designing and in production of the main condenser optical system (116A) accordingly.

According to the present invention, the beam splitting means is disposed by effectively using the space between the first optical means and the second optical means, s that the detector for detecting the integrated exposure amount of the exposure light and the detector for detecting the reflected light from the photosensitive substrate may be provided without a load on designing and production of the condenser optical system while enhancing the illuminance uniformity to the mask.

In still another aspect according to the present invention to achieve the above object, a light exposure system for exposure of a pattern on a first object to form an image thereof through a projection optical system on a second object, comprises:

light source means for supplying exposure light;

off-center multiple beam producing means for producing from the exposure light from said light source means a plurality of light sources eccentric to an optical axis of said projection optical system;

a light condensing optical system disposed coaxial with said projection optical system, for condensing light from said off-center multiple beam producing means to illuminate said first object in an oblique direction;

reflected light detecting means disposed at a position where the plurality of eccentric light sources are formed by said off-center multiple beam producing means and on the optical axis of said light condensing optical system, for detecting reflected light from said second object through said projection optical system and said light condensing optical system; and measuring means for performing a measurement relating to a reflectance of said second object, based on an output of said reflected light detecting means.

According to the present invention as described, in performing the plural oblique illumination, the plural tertiary light sources formed by the optical integrators (134A, 134B) are eccentric to the optical axis of the illumination optical system, as shown in FIG. 11. There is, therefore, a space including the optical axis of the illumination optical system existing among the plural tertiary light sources. In the present invention, the photoelectric conversion device (240) is disposed in the space to effectively utilize the space. By this, the reflected light from the wafer W passes through the projection optical system (PL), the condenser lens (116A), and the mirror (115) to be received by the photoelectric conversion device (240) in the monitor of reflectance of the wafer. Also, since the light receiving surface thereof is disposed at a position conjugate with the pupil plane of the projection optical system (PL), the photoelectric conversion device (240) may receive light with sufficient light quantity.

In this arrangement, there is no need to provide an additional optical member such as a half mirror between the condenser lens (116A) and the plural tertiary light sources. Then, even if the $\sigma$ value of the illumination beams should become greater as a whole, the condenser lens (116A) could be designed independently. Therefore, the design and the production of the condenser lens are easier than those in use of a half mirror in the conventional system. Further, no half mirror is used in this arrangement, so that no light quantity loss is caused and no influence from the flare or the like, which could be caused by the half mirror, is observed.

In case that the annular zone illumination method is employed with lens elements forming the optical integrator being set in the form of hollow cylinder to form a secondary light source (or tertiary light source) of annular zone therewith, there is a vacant space (a space inside the optical integrator) on the optical axis of the secondary light source (or tertiary light source) and a photoelectric conversion device is placed in the space to conduct measurement of reticle position.

In case that an aperture stop (space filter) having an annular opening is disposed on the side of an object to be illuminated before the optical integrator to form an annular secondary light source (or tertiary light source), there is also a vacant space in the center of the aperture stop and the photoelectric conversion device may be positioned in the space.

Further, a case that the optical integrators (134A, 134B) are composed of a plurality of fly eye lenses respectively provided at positions eccentric to the optical axis of the illumination optical system, as shown in FIG. 11, means a case of an illumination optical system employing the so-called plural oblique illumination method. In this case, the tertiary light sources are formed in the proximity of the focal plane of the fly eye lenses (134A, 134B), respectively, on the reticle side. The photoelectric conversion device (240) may be located in the space between the plural fly eye lenses (134A and 134B) accordingly.

In case that the annular secondary light source (or tertiary light source) is formed by such an arrangement that an aperture stop (space filter) having a plurality of openings eccentric to the optical axis is placed before the optical integrator on the side of an object to be illuminated to form the secondary light source (or tertiary light source) eccentric to the optical axis, there is a vacant space in the central portion of the aperture stop and the photoelectric conversion device may be positioned in the space.

According to the present invention, the measurement of reflectance of the wafer may be carried out by effectively using the space in the secondary light source formation plane (or in the tertiary light source formation plane) given by the arrangement of the optical integrator, which is intrinsic in the so-called oblique illumination system or the space among the secondary light sources (or tertiary light sources), which is intrinsic in the annular illumination method. There are advantages of more simplified structure of an optical system for wafer reflectance measurement and of load reduction in designing and in production of the condenser lenses in the illumination optical system.

Further objects, features, and advantages of the present invention will be apparent from the detailed description as described below based on the accompanying drawings.

DESCRIPTION OF THE PREFERRED EMBODIMENTS

Figure 1:
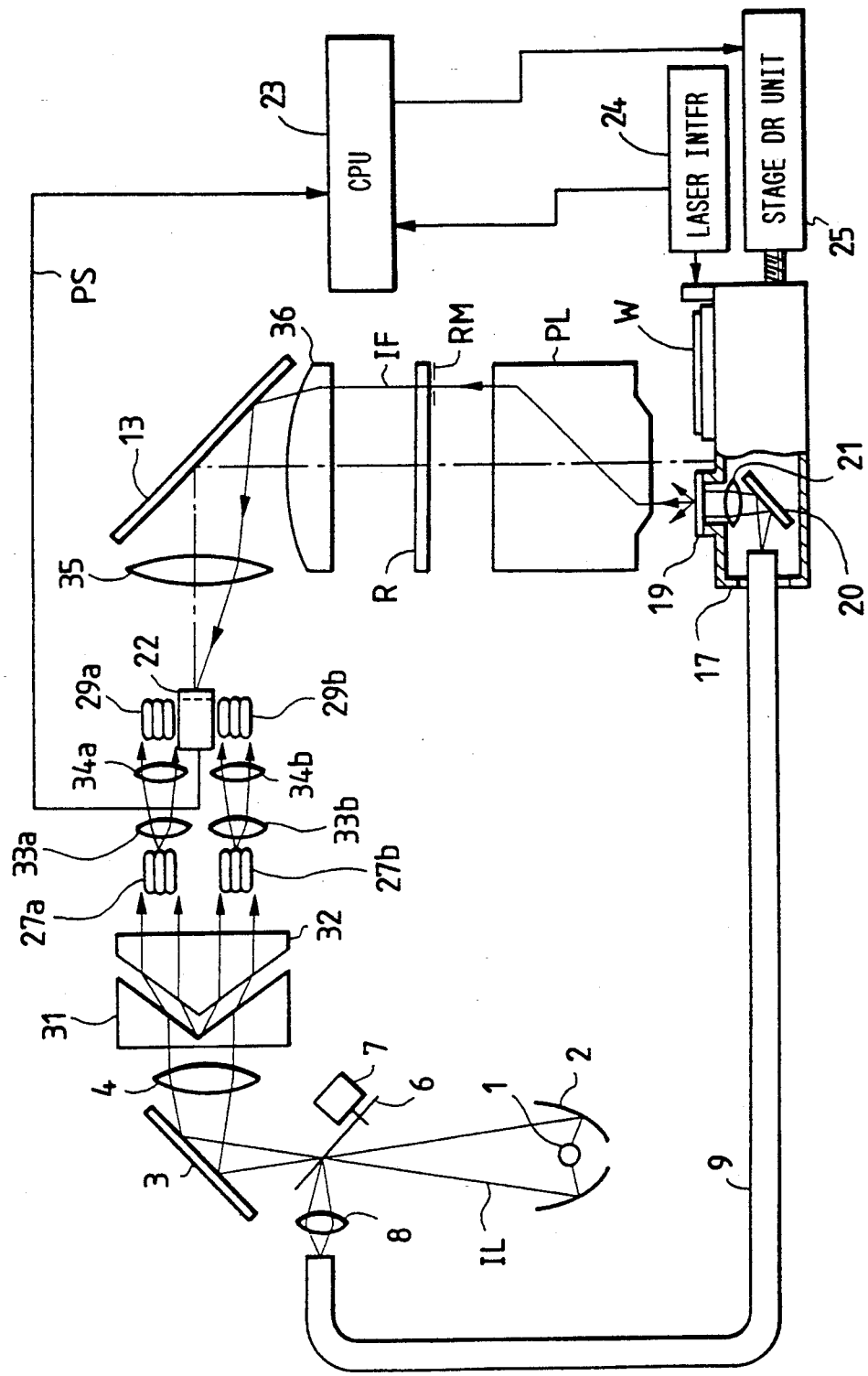
FIG. 1 is a drawing to show an entire structure of a first embodiment of a light exposure system according to the present invention.
Figure 6:
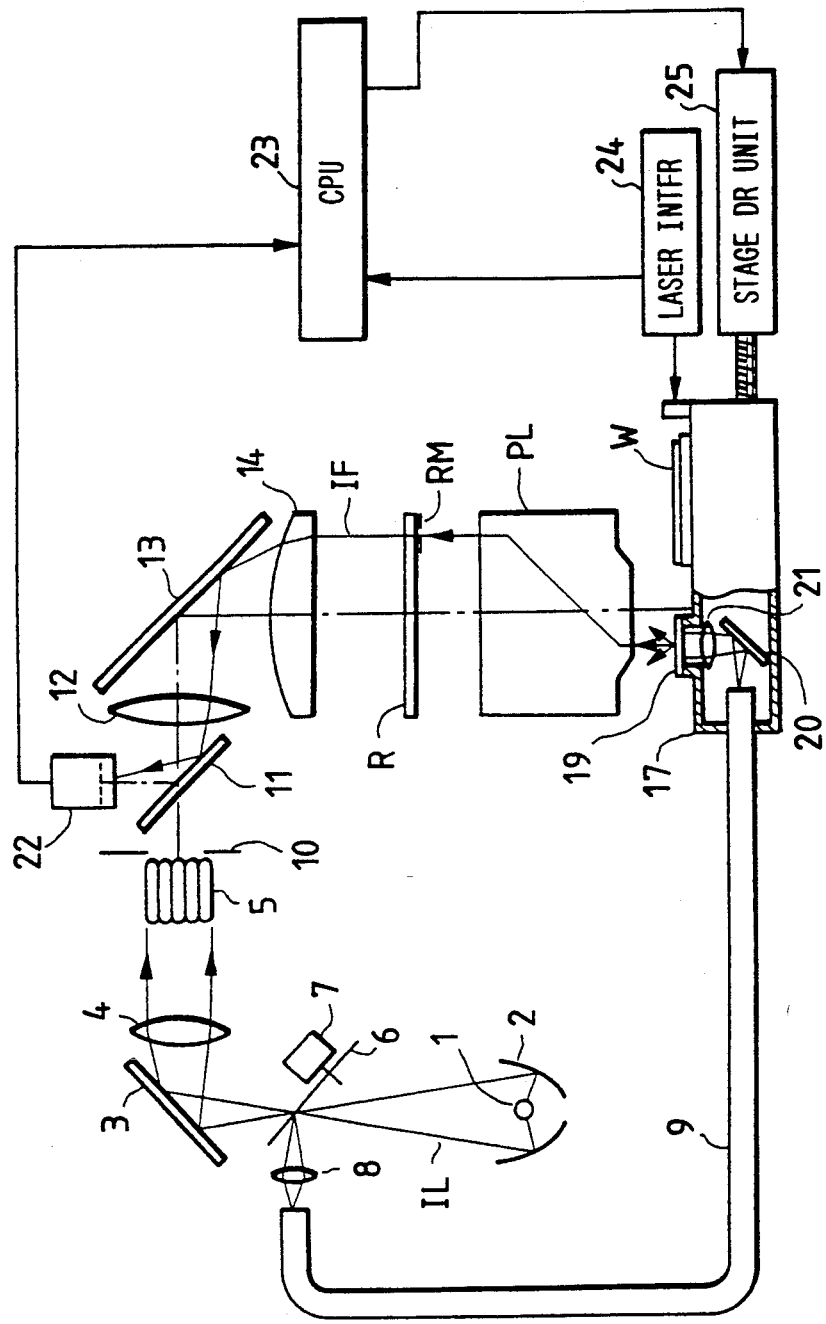
FIG. 6 is a drawing to show an entire structure of a conventional light exposure system provided with an optical system for reticle measurement.

A first embodiment of a light exposure system according to the present invention is below explained with reference to FIG. 1 to FIG. 3. The first embodiment is a projection exposure system, in which the present invention is applied to the projection exposure system as shown in FIG. 6 to modify the illumination optical system into one using the plural oblique illumination method. In FIG. 1, portions corresponding to those in FIG. 6 are given the same numerals and the details thereof are omitted to explain here. In the first embodiment four beams are used to effect the oblique illumination.

FIG. 1 shows a projection exposure system of the first embodiment. In FIG. 1, when the shutter 6 is open, the exposure light IL from the light source 1 is guided through the elliptic mirror 2, the bending mirror 3, and the input lens 4 to the beam splitting means so that rays converged at the second focus of the elliptic mirror 2 turn into parallel rays along the optical axis through the input lens 4. The light source 1 may be a mercury lamp or an excimer laser such as a KrF laser. In case of the excimer laser, a beam shaping optical system for the laser is to be used to obtain desired parallel rays in place of the elliptic mirror 2, the mirror 3 and the input lens 4. The beam splitting means is composed of a first polyhedron prism 31 having a recess of rectangular cone (pyramid shape) and a second polyhedron prism 31 having a protrusion of rectangular cone (pyramid shape). The exposure light IL output from the second polyhedron prism 32 is split into four beams separate at identical angles and intervals around the optical axis.

The four split beams enter respective fly eye lenses 27a, 27b, 27c and 27d of the second group. Although FIG. 1 shows only the fly eye lenses 27a and 27b, there are two more fly eye lenses 27c and 27d disposed on that and this sides to the optical axis in the direction perpendicular to the sheet plane of FIG. 1. A beam output from the fly eye lens 27a passes through a guide optical system composed of the lenses 33a and 34a to be converted into a parallel beam, which enters the fly eye lens 29a of the first group. Similarly, a beam output from the fly eye lens 27b of the second group enters a guide optical system composed of the lenses 33b and 34b to be converted into a parallel beam, which enters the second fly eye lens 29b of the first group. Although omitted in FIG. 1, beams output from the fly eye lenses 27c and 27d of the second group pass through respective guide optical systems to enter the fly eye lenses 29c and 29d of the first group.

Figure 2:
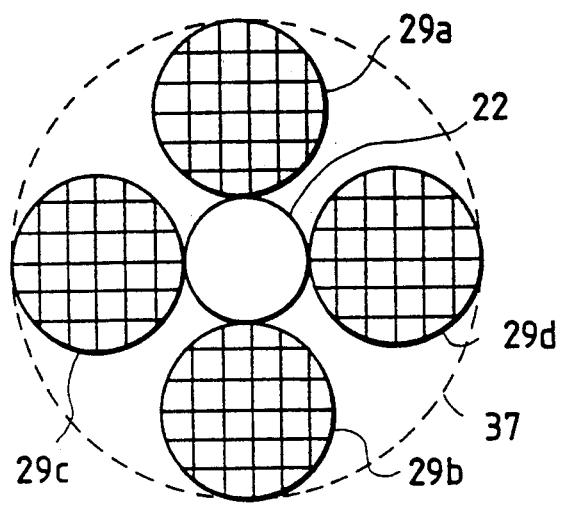
FIG. 2 is a front view of a first group of fly eye lenses in FIG. 1.
Figure 3:
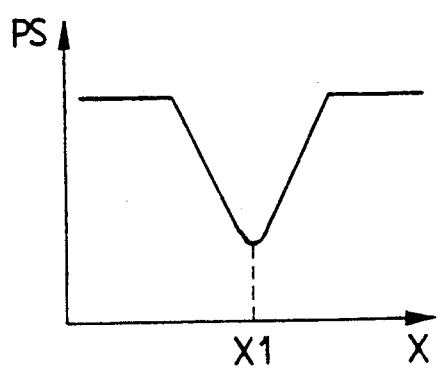
FIG. 3 is a drawing of wave shape to show an example of a photoelectric conversion signal obtained in the first embodiment of FIG. 1.

FIG. 2 is a front view of the fly eye lenses 29a to 29d of the first group. As shown in FIG. 2, the fly eye lenses 29a to 29d are positioned at intervals of 90 degrees around the optical axis. In the first embodiment, the photomultiplier 22 is placed in a space including the optical axis among the fly eye lenses 29a to 29d. Numeral 37 is a circle circumscribing the fly eye lenses 29a to 29d. For example, the $\sigma$ value is set at about 1 for exposure light from an imaginary secondary light source encircled by the circle 37. An outer diameter of each fly eye lenses 29a to 29d is determined such that the $\sigma$ value is about 0.2. Thus, a size of a light receiving surface of the photomultiplier 22 may be set in this example such that the $\sigma$ value is about 0.1 at most.

Figure 7A:
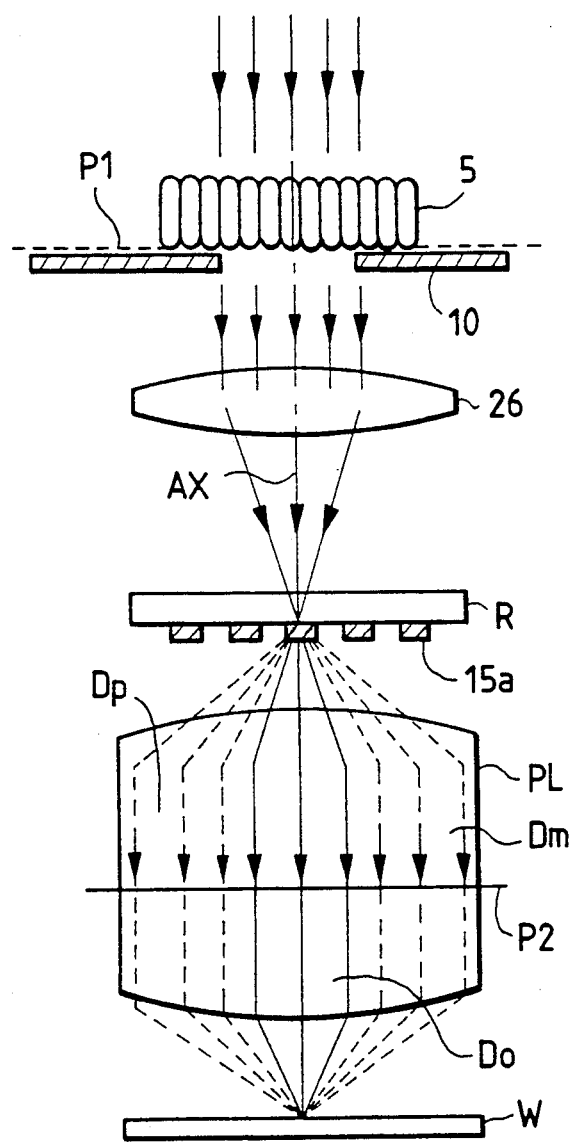
FIG. 7A is a drawing to show a schematic structure of the optical system as shown in FIG. 6.
Figure 7B:
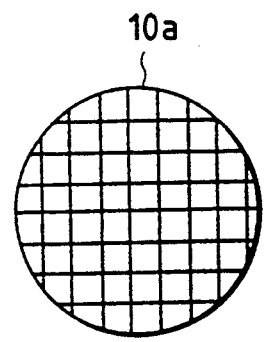
FIG. 7B is a drawing to show an aperture portion of a variable aperture stop in FIG. 6 as seen from the side of a condenser lens 26.
Figure 8:
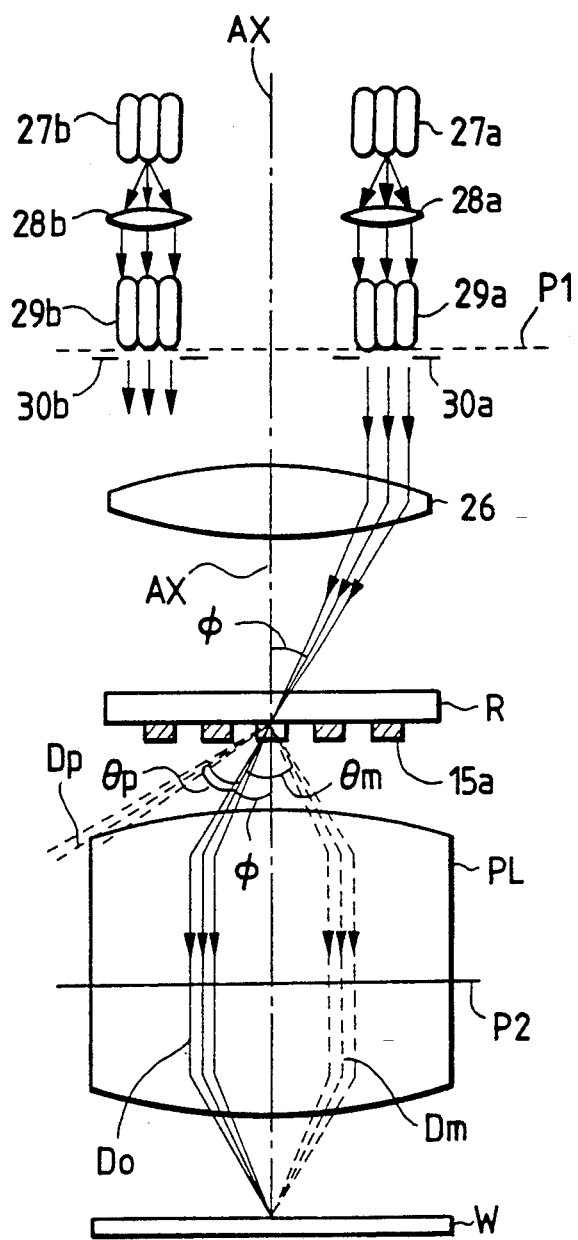
FIG. 8 is a drawing to show a schematic structure of an optical system for performing oblique illumination.

Returning to FIG. 1, the photomultiplier 22 supplies a photoelectric conversion signal PS, which is an output of an amount corresponding to a light intensity incident into the light receiving surface thereof, to the central processing unit (CPU) 23. There are numerous secondary light sources (secondary light source images) formed on the focal plane on the reticle side of the fly eye lenses 29a to 29d of the first group. Variable aperture stops may be provided on the secondary light source formation plane, though omitted in FIG. 1. The exposure light output from the four secondary light sources passes through the first condenser lens 35, the bending mirror 13, and the second condenser lens 36, so that four principal rays thereof become parallel to each other and inclined at a constant angle to the optical axis of the projection optical system PL. The thus-converted beams of the exposure light illuminate the reticle R. By this, such illumination is accomplished that the oblique illumination with two beams as shown in FIGS. 7A and 7B is extended to the oblique illumination with four beams.

In this embodiment, an adjustment plate 19 made with a glass plate is also fixed in the proximity of the wafer holder on the wafer stage 17, and a reference pattern is formed on the upper surface of the adjustment plate 19. A plane on which the reference pattern is formed is set approximately at the same height as an exposure plane on the wafer W in the direction of the optical axis of the projection optical system PL, at least upon measurement of the reticle RM. Several reticle marks RM are formed in the image field of the projection optical system and in the proximity of the pattern area of the reticle R. Then, the exposure light reflected by the shutter 6 is guided through the condenser lens 8, the light guide 9, the bending mirror 20, and the condenser lens 21 to the bottom surface of the adjustment plate 19.

In this case, the output plane of illumination light of the light guide 9 is conjugate with the pupil plane of the projection optical system PL, and the pupil plane of the projection optical system PL is conjugate with the light receiving surface of the photomultiplier 22 and with the secondary light source formation plane of the fly eye lenses 29a to 29d. The pattern formation surface of the reticle R is set on a Fourier transform plane of the secondary light source formation plane. The remaining structure of the present embodiment is the same as that in FIGS. 5A and 5B, and therefore is omitted to explain here.

The following explains an operation in reticle alignment in the present embodiment. In this case, the reference pattern on the adjustment plate 19 is made by forming an opening portion of cross in an evaporated film of chromium. The reticle mark RM on the reticle R has a pattern obtained by multiplying the reference pattern by a projection magnification of the projection optical system PL and inverting bright and dark portions in the pattern. The exposure light from the light source 1 is reflected by the shutter 6, and the reflected exposure light (as will be hereinafter referred to simply as "illumination light") is guided by the condenser lens 8 and the light guide 9 into the wafer stage 17 to illuminate the reference pattern of the adjustment plate 19. The illumination light illuminates the reference pattern vertically upward, and is transmitted therethrough. The illumination light transmitted through the reference pattern forms an image of the reference pattern at a position conjugate with the bottom surface of the reticle R through the projection optical system PL.

The illumination light having passed through the reticle R further passes through the second condenser lens 36, the bending mirror 13, and the first condenser lens 35 to enter the light receiving surface of the photomultiplier 22. Since the light receiving surface of the photomultiplier 22 is conjugate with the output surface of the illumination light through the light guide 9, an image of the output surface of the illumination light through the light guide 9 is formed on the light receiving surface of the photomultiplier 22. Thus, the light receiving surface of the photomultiplier 22 can always receive the image of the output surface of the light guide 20 in a stable manner, even if the wafer stage 17 on which the adjustment plate 19 is mounted moves in the horizontal plane. An intensity of light incident into the light receiving surface changes depending upon a state of superposition of the image of the reference pattern of the adjustment plate 19 on the reticle mark RM. In other words, an output of the photoelectric conversion signal PS having an output property proportional to the intensity of incident light is proportional to a junction product concerning a relative deviation between the reticle mark RM and the reference pattern.

Consider a case that the reference pattern on the wafer stage 17 moves to come into the image field of the projection optical system PL. When the projection image of the reference pattern of the adjustment plate 19 is perfectly superimposed on the reticle mark RM on the bottom surface of the reticle R, the photoelectric conversion signal PS of the photomultiplier 22 takes the minimum value, as shown in FIG. 3. In FIG. 3 the horizontal axis represents a position of the wafer stage 17 in the X direction, which is measured by the laser interferometer 24, and the vertical axis the photoelectric conversion signal PS. Supplying the photoelectric conversion signal PS and the measurement result obtained by the laser interferometer 24 of FIG. 1 to the CPU 23, the CPU 23 can detect a position of the wafer stage 17 where the projection image of the reference pattern is completely superimposed on the reticle mark RM.

When the reticle mark RM is detected by using the arrangement as described, the detection accuracy may be improved by the improvement of throughput and by the light quantity increase in the photomultiplier 22 due to the power increase of exposure light, without light quantity loss which could be caused by provision of the half mirror 11 as in the conventional system as shown in FIG. 6. Further, according to the arrangement of the present embodiment, the influence from the flare, which could be caused by provision of the half mirror 11 as in the conventional system as shown in FIG. 6, may be avoided, so that the illuminance evenness of the exposure light may be improved on the wafer W, and errors in position measurement may be greatly decreased in reticle alignment.

Further, measuring positions of the several reticle marks RM relative to the wafer stage 17 as described above, a coordinate of the center position and a rotation angle of the reticle R on the wafer stage 17 may be calculated by the CPU 23. Then, the reticle driving mechanism may be operated under control of the CPU 23 to carry out the reticle alignment quickly. Moreover, in the present embodiment, if a reticle exclusively used for measurement is used with a plurality of reticle marks RM disposed in the pattern area and if the wafer stage 17 is moved to measure a position of the reference pattern of the adjustment plate 19 relative to the plural reticle marks RM, the projection magnification and the distortion in the image field of the projection optical system PL would be also measured. Since there is no half mirror necessary in the present embodiment between the optical integrator comprised of the fly eye lenses 29a to 29d and the condenser lenses 35, 36, the design and the production of the condenser lenses 35, 36 are easier than those in the conventional system, even with a large $\sigma$ value for example of about 1 as a whole.

Figure 4:
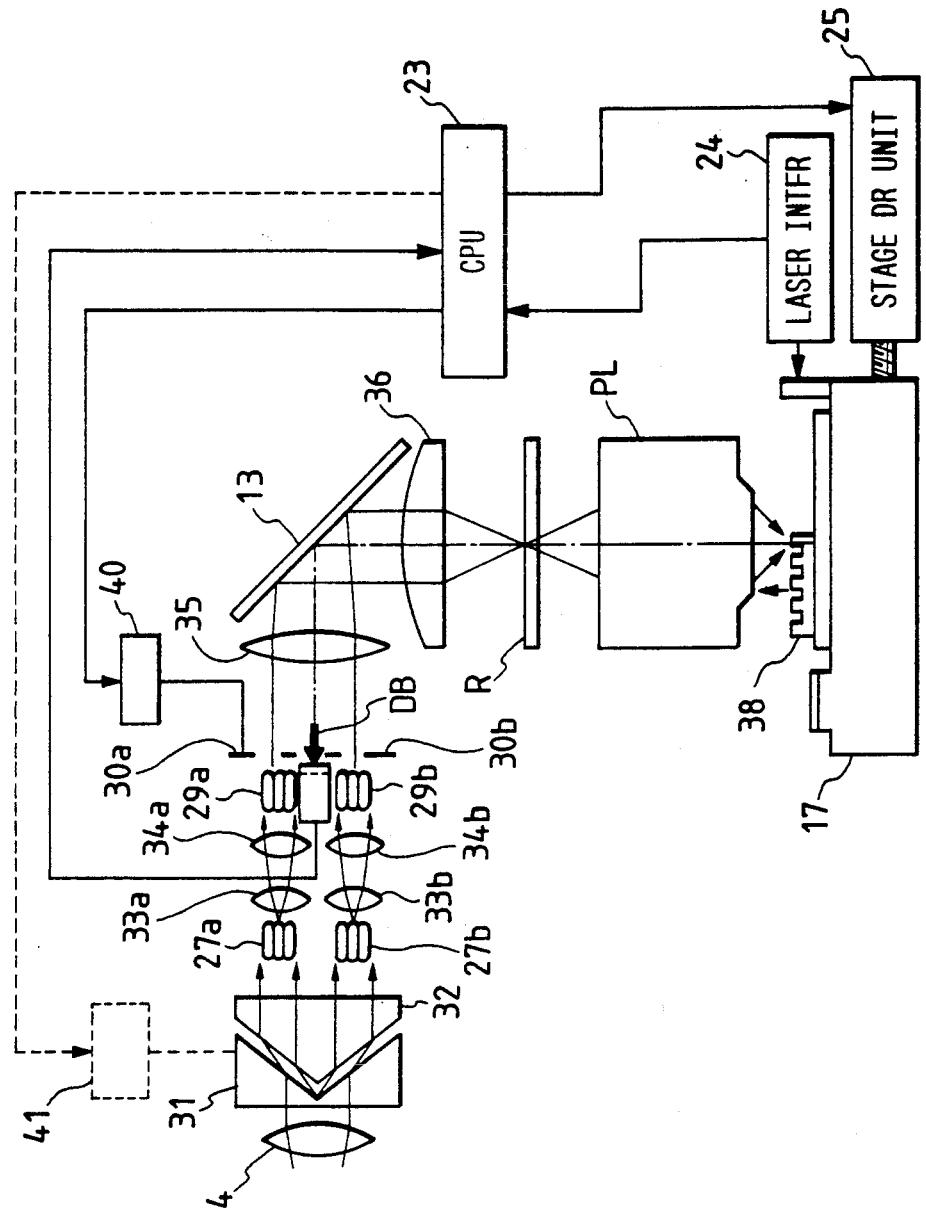
FIG. 4 is a drawing to show a first modification in which another measurement is carried out using the system of FIG. 1.

The next example shows an application of the projection exposure system as shown in FIG. 1 in which the illumination unevenness of the exposure light obliquely illuminating the wafer W in the four directions is measured. The application is described with reference to FIG. 4. FIG. 4 shows a structure with the main part of FIG. 1. In FIG. 4, reference numeral 38 designates a phase grating of reflection type, which is installed at a height substantially same as the exposure surface of the wafer on the wafer stage 17. Further, four variable aperture stops 30a to 30d are provided for the fly eye lenses 29a to 29d of the first group on the output side thereof. The variable aperture stops 30a to 30d change respective stop apertures and function as shutters for completely cutting off the respective output beams of the fly eye lenses 29a to 29d of the first group. A drive unit 40 controlled by the CPU 23 executes opening and closing of the apertures of the variable aperture stops 30a to 30d. The other structure is the same as that in FIG. 1. The exposure light output from the fly eye lenses 29a and 29b is guided through the first condenser lens 35, the bending mirror 13, and the first condenser lens 36 to illuminate the reticle R in the same manner as upon normal exposure. The exposure light having passed through the reticle R is converged on a surface of the phase grating 38 through the projection optical system PL.

In this example of oblique illumination with four beams, principal rays of four beams of the exposure light illuminating the phase grating 38 intersect one another at certain angles. Thus, the phase grating 38 should have such a grating pitch that the first order diffracted light beams DB of the four beams in the exposure light are reflected vertically upward. The phase grating 38 is a two-dimensional grating of plaid pattern having an identical pitch P in two directions perpendicular to each other and corresponding to the arrangement directions of the fly eye lenses 29a to 29d of the first group positioned to face one another around the optical axis. The pitch P of the phase grating 38 is determined to satisfy a relation of $P = \lambda/\sin\theta$, where B is an incident angle of the exposure light obliquely illuminating the phase grating 38 and $\lambda$ is a wavelength of the exposure light. The phase grating 38 has the substantially same size as one shot area exposed by the projection optical system PL on the wafer W. Further, the depth of grooves in the phase grating 38 is defined to extinguish the zeroth order light of the four beams in the exposure light. By this arrangement, the first order diffracted light beams are emitted from the phase grating 38 toward the projection optical system PL vertically upward.

The phase grating 38 may be a one-dimensional grating, in which the grating is inclined at 45 degrees to the two directions perpendicular to each other and corresponding to the arrangement directions of the fly eye lenses 29a to 29d of the first group while facing one another around the optical axis, and the pitch of the grating is preferably $P \times 2^{-0.5}$. Further, in the present embodiment, the grating 38 is a phase grating in order to avoid the light quantity loss caused by generation of the zeroth order light, but the grating may theoretically be an intensity grating having a periodic pattern of bright and dark portions. The first order diffracted light beams DB pass through the projection optical system, the reticle R, the second condenser lens 36, the bending mirror 13, and the first condenser lens 35 to enter the light receiving surface of the photoelectric conversion device of the photomultiplier 22 or the like. As for the beam advancing along the optical axis of the projection optical system PL, the light quantity received by the light receiving surface of the photomultiplier 22 does not vary without transmittance unevenness in the illumination optical system and the projection optical system, even if the phase grating 38 moves in the image field of the projection optical system PL.

Next explained is a measurement of illumination unevenness in the exposure light with four beams obliquely illuminating the wafer W in the four directions.

The phase grating 38 is first positioned by the stage driving unit 25 in the exposure area of the projection optical system PL. In order to measure an illumination condition when the exposure light output from the fly eye lens 30a of the first group illuminates the wafer W, an aperture diameter of the variable aperture stop 30a is set through the drive unit 40 to be the same aperture size as in actual exposure, and the other three apertures of the variable aperture stops 30b, 30c, 30d are closed.

By this, the exposure light output from the fly eye lens 30a of the first group passes through the first condenser lens 35, the mirror 13, the second condenser lens 36, the reticle R, and the projection optical system PL to obliquely illuminate the phase grating 38 at an incident angle $\theta$. Then, the first order diffracted light beam DB is emitted by the phase grating 38 in the direction of the optical axis of the projection optical system. The first order diffracted light beam DB passes through the projection optical system PL, the reticle R, the second condenser lens 36, the mirror 13, and the first condenser lens 35 to reach the photomultiplier 22. An amplitude of a signal output of the photomultiplier 22 is stored in a memory unit inside the CPU 23.

Similarly, each aperture diameter of the variable aperture stops 30b, 30c, 30d is set to be the same aperture diameter as in actual exposure, and respective amplitudes of output signals of the first order diffracted light beams DB, which are detected by the photomultiplier 22 through the diffraction effect of the phase grating 38, are sequentially stored in the memory unit inside the CPU 23.

A signal comparison processing unit inside the CPU 23 compares the four amplitudes of the output signals thus obtained by the above operation with one another to measure a dispersion of light intensity in the exposure light obliquely illuminating the wafer in the four directions.

In this measurement, the variable aperture stops 30a to 30d are sequentially opened one by one to output the respective exposure light from the fly eye lenses 29a to 29d of the first group, and the respective exposure light passes through the same optical path as in actual exposure while affected by the same optical system as in actual exposure. After that, the respective exposure light passes through the same optical path through the diffraction effect of the phase grating 38 to be detected by the photomultiplier 22. Therefore, the dispersion of light intensity of the exposure light, which is one upon actual oblique illumination on the wafer, may be accurately measured at a higher accuracy.

The normal reticle R for actual exposure is used in measurement as described in the present embodiment, while a transparent reticle (parallel flat plate) may be exclusively used for the measurement instead thereof in another embodiment. Further, the measurement can be carried out without the reticle R The variable aperture stops 30a to 30d are used as measurement light extracting means for selectively extracting a beam output from each of the fly eye lenses 29a to 29d in the present embodiment, while shutters may be placed in respective optical paths split into four between the second polyhedron prism 32 and the output side of the fly eye lenses 29a to 29d in a further embodiment. Additionally, a stop of turret type having a plurality of apertures may be employed for selectively extracting the four beams and simultaneously outputting the four beams.

If it is found after completion of the measurement in the present embodiment as described that a dispersion exists among the intensities of light obliquely illuminating the wafer in the respective directions, correcting means carries out correction of the dispersion for example by moving the variable aperture stops 30a to 30d independently in the direction of the optical axis by means of driving means 40 controlled by the CPU 23 based on the measurement result or by moving the first polyhedron prism 31 in the direction normal to the optical axis by driving means 41 controlled by the CPU. Another correcting means would be filters (light reducing members) having a certain transmittance disposed in the respective parallel optical paths between the input lens 4 and the variable aperture stops 30a to 30d. In a still further arrangement, filters having a certain transmittance are disposed in the respective optical paths, which can be inclined.

As described, the dispersion is corrected by the correcting means among the intensities of light obliquely illuminating the wafer in the respective directions, so that the oblique illumination may be achieved with the optimum balance of light quantity.

Figure 5A:
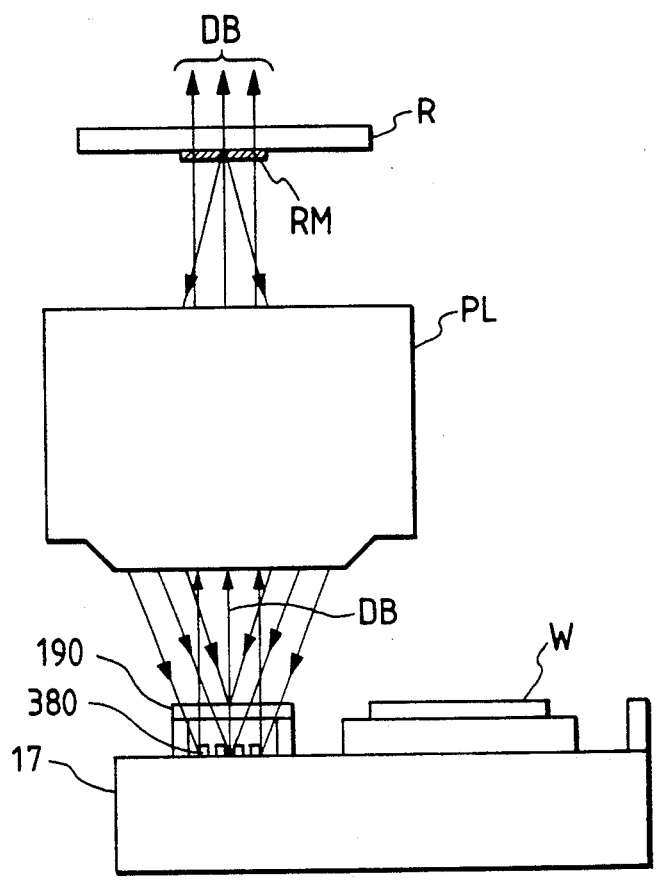
FIG. 5A and FIG. 5B are constitutional drawings of main portions to illustrate a second modification as a further application of the apparatus as shown in FIG. 4.
Figure 5B:
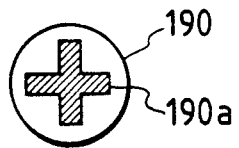

Although the illumination unevenness of the illumination light is measured in the embodiment as shown in FIG. 4 by detecting the four first order diffracted light beams DB of the exposure light obliquely illuminating the phase grating 38, the reticle alignment may also be achieved in the same manner as in the embodiment as shown in FIG. 1 by further utilizing the first order diffracted light beams DB. For example, as shown in FIG. 5A and FIG. 5B, a reference pattern 190 on which a light shield 190a of cross for reticle alignment is formed is set on the same plane as the wafer 18, and a phase grating 380 is disposed apart at a predetermined distance below the reference pattern 190, whereby the measurement of illumination unevenness and the reticle alignment can be carried out. The embodiment as shown in FIG. 5A shows only a structure around the projection optical system PL with the same fundamental structure as the system of FIG. 4, and therefore the portions having the same functions as in FIG. 4 are given the same numerals.

Specifically, when the exposure light first obliquely illuminates the reference pattern 190, the exposure light having passed through the reference pattern 190 is diffracted by the phase grating 380 to emit first order diffracted light beams DB vertically upward. The first order diffracted light beams DB illuminate the reference pattern 190 from the bottom thereof and pass therethrough. The first order diffracted light beams DB further pass through the projection optical system 160 and the reticle mark R then to be finally detected by the photomultiplier 22 as not shown in FIG. 5A. Thus, the reticle alignment can be carried out with detection signals of the photomultiplier 22.

The reference pattern 190 is then obliquely illuminated consecutively by the four beams of the exposure light, and the first order diffracted light beams DB emitted through the reference pattern 190 and the phase grating 380 are consecutively detected by the unrepresented photomultiplier 22, whereby the measurement of illumination unevenness may be achieved.

In the system as shown in FIG. 5A and FIG. 5B as described, the reticle alignment and the measurement of illumination unevenness can be achieved without need of an optical system for illuminating the reference pattern 190 for reticle alignment.

Although the plural oblique illumination is conducted in the above embodiment, there is a space including the optical axis but excluding the secondary light sources apart from the optical axis or a space including the optical axis among the secondary light sources of annular zone around the optical axis in case of oblique illumination with one beam using only one fly eye lens 29a of FIG. 1 or in case of the conventional annular illumination, respectively. Thus, the measurement of reticle position may be readily carried out by arranging a photoelectric conversion device such as a photomultiplier in the space. Additionally, the fly eye lens is used as the optical integrator in the above embodiment, while a rod lens may be used as the optical integrator in another embodiment. In case that a plurality of rod lenses are disposed at identical intervals of angle around the optical axis, the secondary light source formation plane is formed in the proximity of the output surface of the respective rod lenses, and therefore a light receiving surface of the photoelectric conversion device may be positioned on the optical axis in the proximity thereof.

Further, in case that an aperture stop (space filter) having an aperture portion of predetermined shape is disposed before the optical integrator on the object side and that the secondary light source formed by the optical integrator is formed in a predetermined shape to effect the plural oblique illumination or the annular zone illumination, there is also a space in the central portion of the aperture stop and the photoelectric conversion device may be disposed in the space. In case of the plural oblique illumination, the aperture stop should have a plurality of apertures eccentric to the optical axis, while in case of the annular zone illumination, the aperture stop should have an aperture of annular shape.

Moreover, in case that a plurality of fly eye lenses are disposed in series along the optical axis while being eccentric to the optical axis, the photoelectric conversion device may be disposed in a space on the optical axis at the position of the fly eye lens closest to the object to be illuminated and eccentric to the optical axis.

Figure 11:
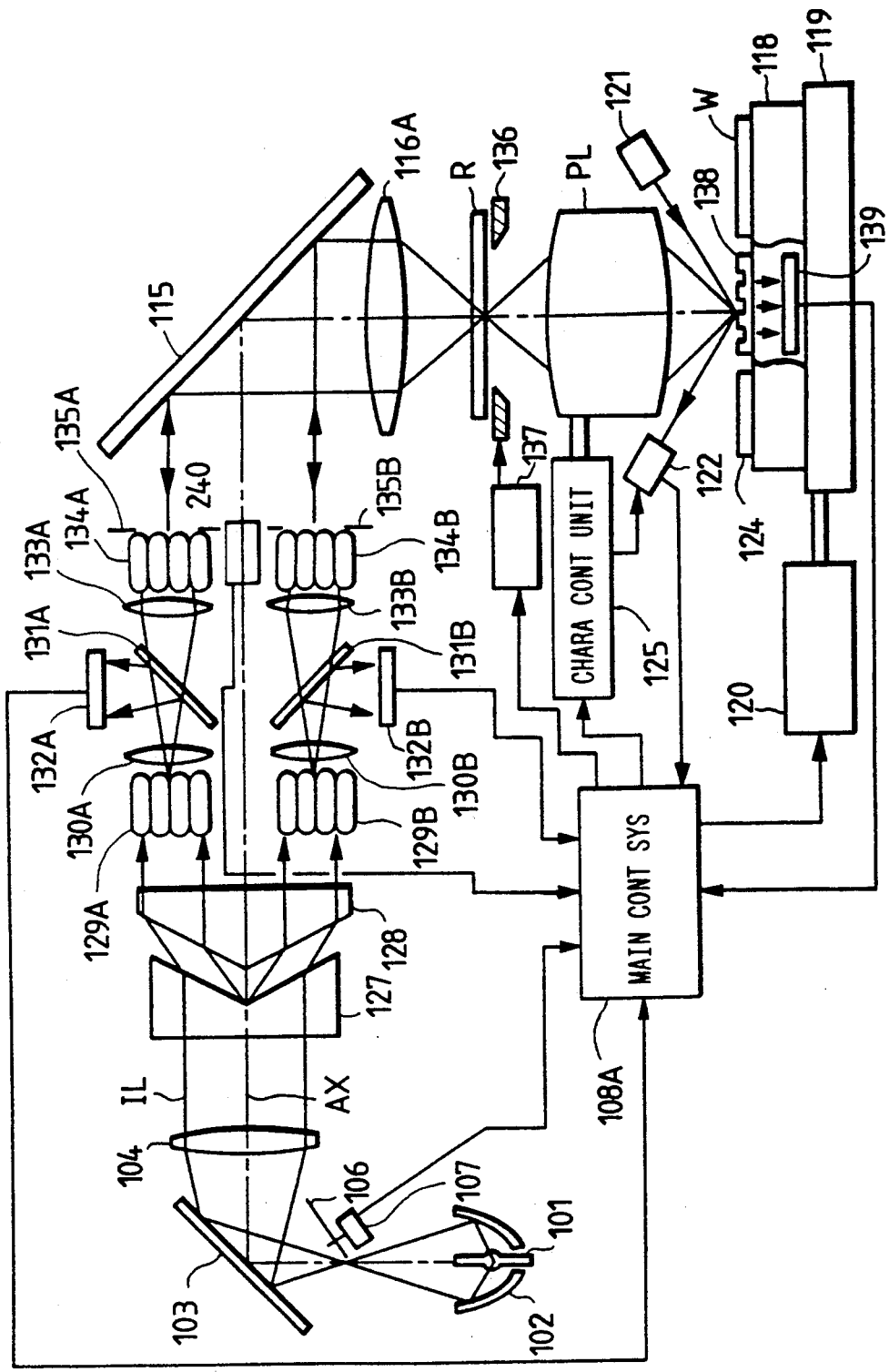
FIG. 11 is a drawing to show an entire structure of a third embodiment of the light exposure system according to the present invention.

Although the embodiments as shown in FIGS. 1 to FIG. 5B relate to examples in which the detector 22 is for measurement of reticle position or for measurement of light quantity balance of illumination light for oblique illumination, the measurement is not limited to those as shown. For example, as will be described in the third embodiment as shown in FIG. 11, the detector 22 as shown in FIG. 1 may be structured to photoelectrically detect the reflectance of the wafer W to measure the reflectance of the wafer W by the CPU 23.

Figure 9:
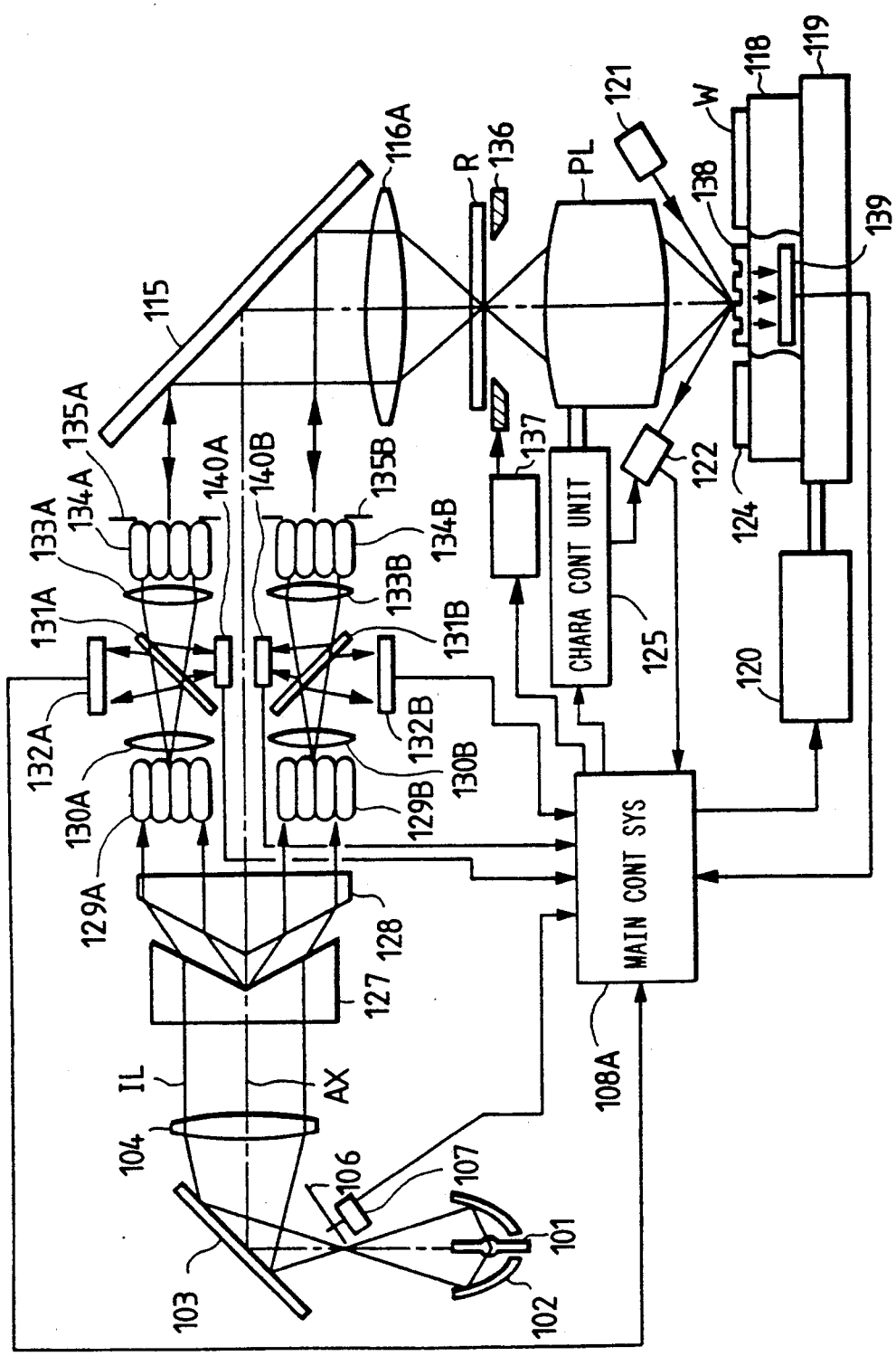
FIG. 9 is a drawing to show an entire structure of a second embodiment of the light exposure system according to the present invention.
Figure 12:
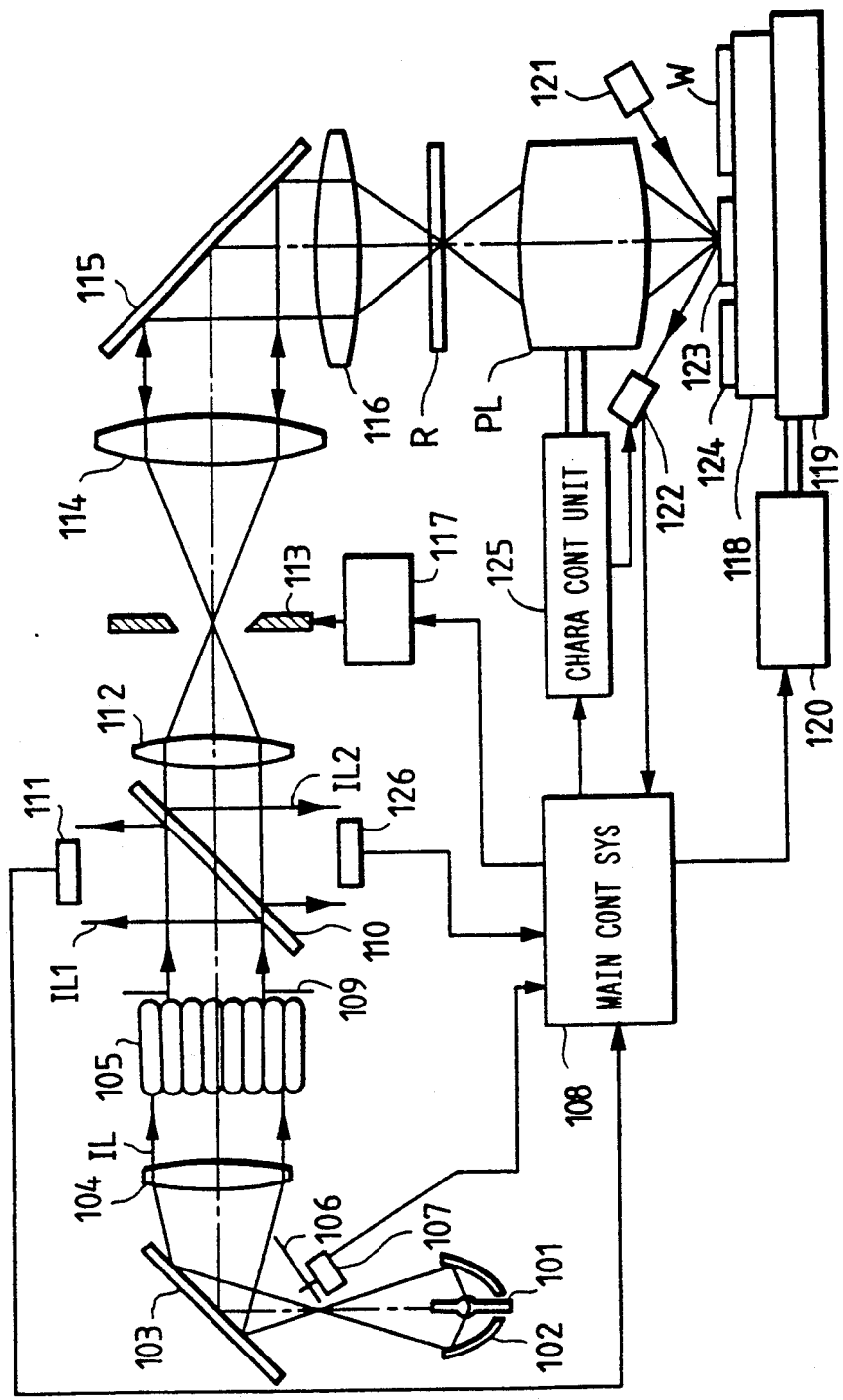
FIG. 12 is a drawing to show an entire structure of a conventional light exposure system provided with a control mechanism of imaging characteristic of a projection optical system.

A second embodiment of the light exposure system according to the present invention is next explained with reference to FIG. 9 and FIG. 10. In the present embodiment, the present invention is applied to a projection exposure system in which the imaging characteristic of the projection optical system can be controlled and the so-called plural oblique illumination is performed. In FIG. 9, portions corresponding to those in FIG. 12 are given the same numerals, and the details thereof are omitted to explain here.

FIG. 9 shows the entire structure of the projection exposure system in the second embodiment. In FIG. 9, the exposure light IL output from the input lens 104 enters a first polyhedron prism 127 having a recess with an output surface of V shape. The exposure light is output from the first polyhedron prism 127 in a direction to leave the optical axis AX, then enters a second polyhedron prism 128 having a protrusion with an input surface of inverse V shape, and is then output from the second polyhedron prism 128 in two beams substantially parallel to the optical axis AX, eccentric to the optical axis AX, and separate from each other.

The oblique illumination is effected with two beams to illuminate the reticle R in the present embodiment, while the oblique illumination may be effected for example with four beams to illuminate the reticle R in a modification. In such a modification, the first polyhedron prism 127 should be replaced by a polyhedron prism having a recess of rectangular cone on the output surface thereof, and the second polyhedron prism 128 by a polyhedron prism having a protrusion of rectangular cone on the input surface thereof. In this modification, an additional optical system is necessary for each of a first optical integrator and a second optical integrator, which is disposed in axial symmetry with another in the direction normal to the sheet plane of FIG. 1, as described below.

In FIG. 9, numerals 129A and 129B denote fly eye lenses disposed eccentric to the optical system AX in axial symmetry, which constitute the first optical integrator. Two beams of the exposure light IL output from the second polyhedron prism 128 enter the fly eye lenses 129A and 129B, respectively. One beam emitted from the fly eye lens 129A passes through a front guide optical system 130A, a beam splitter 131A having a high transmittance but a low reflectance, and a rear guide optical system 133A to enter a fly eye lens 134A. The other beam emitted from the front fly eye lens 129B passes through a front guide optical system 130B, a beam splitter 131B having a high transmittance but a low reflectance, and a rear guide optical system 133B to enter a fly eye lens 134B. The rear fly eye lenses 134A and 134B constitute the second optical integrator.

A first integrated exposure amount monitor 132A composed of a photoelectric conversion device is disposed at a position in a direction in which the beam splitter 131A reflects the exposure light beam directed from the front guide optical system 130A to the rear guide optical system 133A as leaving the optical axis AX, while a second integrated exposure amount monitor 132B comprised of a photoelectric conversion device is at a position in a direction in which the beam splitter 131B reflects the other exposure light beam detected from the front guide optical system 130B and the rear guide optical system 133B as leaving the optical axis AX. Light receiving surfaces of the integrated exposure amount monitors 132A and 132B are placed on rear focal planes of the front guide optical systems 130A and 130B, respectively, and detection signals of the integrated exposure amount monitors 132A and 132B are supplied to a main control system 108A.

In this case, a secondary light source of the exposure light IL is formed on the rear focal plane of the front fly eye lens 129A, and light from the secondary light source is converted into a parallel beam by the guide optical systems 130A and 133A to enter the rear fly eye lens 134A, whereby a tertiary light source of the exposure light IL is formed on the focal plane of the fly eye lens 134A on the rear side (reticle R side). Therefore, the rear focal plane of the front fly eye lens 129A is conjugate with the rear focal plane of the rear fly eye lens 134A. Similarly, the rear focal plane of the front fly eye lens 129B is conjugate with the rear focal plane of the rear fly eye lens 134B.

Variable aperture stops 135A and 135B are disposed on the rear focal planes of the fly eye lenses 134A and 134B, respectively. The exposure light output from the variable aperture stops 135A and 135B passes through the mirror 115 and a main condenser lens 116A to illuminate the reticle R in such a condition that principal rays thereof are inclined to the optical axis. The exposure light output from the reticle R is converged through the projection optical system PL on a wafer W, and a pattern on the reticle R is replicated on an exposure surface of the wafer W. In this case, a variable reticle blind 136 is placed on the bottom of the reticle R, and a main control system 108A changes a shape of the variable reticle blind into a predetermined state through a drive unit 137. Only a pattern of the reticle R assigned by the variable reticle blind 136 is replicated on the wafer W.

Also in the present embodiment, the wafer W is held on a Z stage 118, the Z stage 118 is mounted on an X-Y stage 119, and a reference reflection plate 124 is fixed in the vicinity of the wafer W o the Z stage 118. Further, a diffraction grating 138 of phase type with light transmissibity is fixed in the vicinity of the wafer W on the Z stage 118, and an irradiation amount monitor 139 comprised of a photoelectric conversion element is installed inside the Z stage on the bottom side of the diffraction grating 138. A detection signal of the irradiation amount monitor 139 is supplied to the main control system 108A. The X-Y stage 119 is moved to set the diffraction grating 138 in the exposure area of the projection optical system PL, and actual exposure energy may be detected through the projection optical system PL by the irradiation amount monitor 139.

Figure 10:
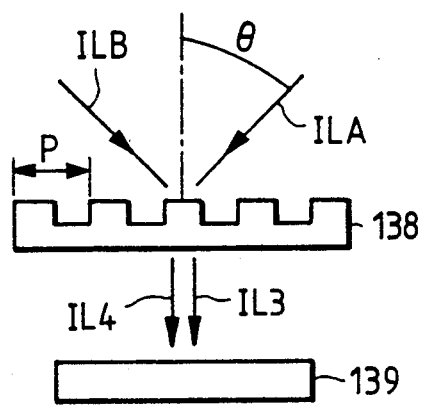
FIG. 10 is an enlarged drawing to show a diffraction grating 138 and an irradiation amount monitor 138 in FIG. 9.

In this case, as shown in FIG. 10, exposure light beams ILA and ILB are emitted from the projection optical system PL toward the diffraction grating 138 such that principal rays are inclined at respective angles of $\theta$ to the optical axis of the projection optical system PL. If a wavelength of the exposure light beams ILA and ILB is $\lambda$, a pitch P of the diffraction grating 138 should be set in the following relation in a direction parallel to a plane including the principal rays of the exposure light beams ILA and ILB.

$$P \cdot \sin \theta = \lambda \tag{6}$$

If the equation (6) stands, for example, a + first order diffracted light beam IL3 of the exposure light ILA is incident substantially normally from the diffraction grating 138 into the light receiving surface of the irradiation amount monitor 139, while for example, a − first order diffracted light beam IL4 of the exposure light ILB is incident substantially normally from the diffraction grating 138 into the light receiving surface of the irradiation amount monitor 139. By this, an efficiency of light reception of the exposure light beams ILA and ILB is improved in the irradiation amount monitor 139. A diffraction grating of amplitude type may be substituted for the diffraction grating 138 of phase type, with which, for example, ± first order diffracted light beams are emitted vertically downward.

Returning to FIG. 9, the exposure light reflected by the wafer W or by the reference reflection plate 124 on the Z stage 118 passes through the projection optical system PL, the reticle R, the main condenser lens 116A, and the mirror 115 to enter the aperture portions of the variable aperture stops 135A and 135B. One beam of the exposure light returning to the aperture portion of the variable aperture stop 135A passes through the fly eye lens 134A and the rear guide optical system 133A to enter the beam splitter 131A. The exposure light is reflected by the beam splitter 131A in the direction of the optical axis AX to enter the light receiving surface of the first reflectance monitor 140A comprised of a photoelectric conversion device. The other beam of the exposure light returning to the aperture portion of the other variable aperture stop 135B passes through the fly eye lens 134B and the rear guide optical system 133B to enter the beam splitter 131B, and is then reflected by the beam splitter 131B in the direction of the optical axis AX. The reflected exposure light beam enters the light receiving surface of the second reflectance monitor 140B comprised of a photoelectric conversion device. The light receiving surfaces of the reflectance monitors 140A and 140B are located on the front focal planes of the guide optical systems 133A and 133B, respectively, and detection signals of the reflectance monitors 140A and 140B are supplied to the main control system 108A.

In this case, the rear focal planes (secondary light source formation plane) of the front fly eye lenses 130A, 130B and the rear focal planes (tertiary light source formation plane) of the rear fly eye lenses 134A, 134B are Fourier transform planes of the pattern formation plane of the reticle R (besides exposure plane of the wafer W), and the light receiving surfaces of the integrated exposure amount monitors 132A and 132B are conjugate with the exposure plane of the wafer W. The front focal planes of the rear fly eye lenses 134A, 134B are substantially conjugate with the exposure plane of the wafer W and with the pattern formation plane of the reticle R, and the light receiving surfaces of the reflectance monitors 140A and 140B are substantially conjugate with the secondary light source formation plane and with the tertiary light source formation plane.

Thus, a light quantity of the exposure light beams directed toward the reticle R may be always monitored by the integrated exposure amount monitors 132A, 132B, and a quantity of reflected light from an object on the Z stage 118 may be monitored by the reflectance monitors 140A, 140B. In this case, there are the beam splitters 131A and 131B disposed in the space between the first optical integrator and the second optical integrator, so that a load is relieved on designing and production of the illumination optical system including the main condenser lens 116A. Further, the entire system may be made compact, because the reflectance monitors 140A and 140B ar disposed while effectively utilizing the space near the optical axis AX.

The main control system 108A of the present embodiment estimates a change amount of imaging characteristic for example of magnification error or focus position of the projection optical system PL, based on the detection signals of the integrated exposure amount monitors 132A, 132B, the irradiation amount monitor 139, and the reflectance monitors 140A, 140B and on information such as the aperture shape of the variable reticle blind 136. The main control system 108A controls the imaging characteristic of the projection optical system PL through the characteristic control unit 125 to cancel the change amount of the imaging characteristic, and adjusts the offset of the focus detection signal in the light receiving optical system 122 of the focus detection system through the characteristic control unit 125 with necessity.

Next explained is an example of use method of the integrated exposure amount monitors 132A and 132B.

In this case, the memory inside the main control system 108A stores information of an integration value of the detection signals of the integrated exposure amount monitors 132A, 132B corresponding to an integrated exposure amount necessary for replication of the pattern image of the reticle R onto the wafer W, and the wafer W is set in the exposure area of the projection optical system PL. The main control system 108A opens the shutter 106 through the drive motor 107, and then integrates the detection signals of the integrated exposure amount monitors 132A and 132B. When the integration value reaches the value preliminarily stored, the main control system 108A stops the exposure by closing the shutter 106. The optimum exposure amount is obtained by this operation.

Next explained is an example of control method of imaging characteristic of the projection optical system PL in the present embodiment. In this case, the main control system 108A obtains for each exchange of the reticle R a load of irradiation amount of the exposure light on the projection optical system PL according to the transmittance of the reticle R which is determined by the pattern density of a reticle R and an opening rate of the variable reticle blind 136. For that, the main control system 108A drives the X-Y stage 119 through the drive unit 120 to move the diffraction grating 138 and the irradiation amount monitor 139 int the exposure area of the projection optical system PL, thereafter measures a ratio of the detection signal of the irradiation amount monitor 139 to the detection signal of the integrated exposure amount monitor 132A, 132B, that is, a ratio of the irradiation amount after passage through the reticle R to the exposure amount before the reticle R, and then stores it.

Further, in order to measure a load of return irradiation amount to the projection optical system PL according to the reflectance of the wafer W, the main control system 108A drives the X-Y stage 119 for each exchange of reticle R in the same conditions as in the above case to move the reference reflection plate 124, which has a known reflectance, into the exposure area of the projection optical system PL. The main control system 108A obtains a ratio of the detection signal of the reflection monitor 140A, 140B to the detection signal of the integrated exposure amount monitor 132A, 132B, that is, a ratio of the reflected light amount from the reference reflection plate 124 to the exposure amount before the reticle R, and then stores it.

After that, each time the wafer W to be exposed is set in the exposure area of the projection Optical system PL, a ratio of the detection signal of the reflectance monitor 140A, 140B to the detection signal of the integrated exposure amount monitor 132A, 132B, and a reflectance of the wafer W to be exposed is obtained by comparing the ratio with that obtained with the reference reflection plate 124 as described. An irradiation amount of light returning from the wafer W to the projection optical system PL is obtained by this operation.

Incidentally, the irradiation amount of the exposure light through the projection optical system and the reflected light amount from the wafer W vary depending upon a shape of the aperture portions of the variable aperture stops 135A, 135B, that is, depending upon a difference of pattern of the tertiary light source, even if the reticle R and the wafer W are unchanged. Then, the irradiation amount and the reflected light amount of the exposure light are standardized as respective ratios thereof to the exposure amount detected by the integrated exposure amount monitors 132A and 132B, and are then stored.

After the above preparation, while the wafer W is successively exposed to the exposure light, the integrated exposure amount, which is always monitored by the integrated exposure amount monitors 132A, 132B, is multiplied by the ratio of irradiation amount or by the ratio of reflected light amount as described whereby obtaining the integrated exposure amount or the reflected light amount for the projection optical system PL up to the moment. Consequently, the main control system 108A adjusts the imaging characteristic of the projection optical system PL through the characteristic control unit 125, based on the integrated exposure amount and the reflected light amount, and executes the offset adjustment of the focus detection signal of the light receiving optical system 122 with necessity. By this operation, the pattern of the reticle R may be always replicated at a high resolution on each shot area of the wafer W.

Finally, a third embodiment of the light exposure system according to the present invention is briefly explained in the following with reference to FIG. 11. The third embodiment as shown in FIG. 11 shows an example in which the reflectance monitors (140A, 140B) as shown in the second embodiment of FIG. 9 are disposed in a space formed on the optical axis among the rear fly eye lenses (134A, 134B) in the same manner as in the first embodiment of FIG. 1. In FIG. 11, portions having the same functions as in FIG. 9 are given the same numerals.

A light receiving surface of a reflectance monitor 240 is disposed at a position conjugate with a pupil plane of the projection optical system PL, and the exposure light reflected from the wafer W or the reference reflection plate 124 on the Z stage 118 is guided through the projection optical system PL, the reticle R, the main condenser lens 116A, and the mirror 115 to be detected by the reference monitor 240.

The functions of the respective portions and the operation of the third embodiment are fundamentally the same as those in the second embodiment as shown in FIG. 9, and, therefore, the details thereof are omitted to explain here. Also in the third embodiment, the same advantage may be enjoyed in the same manner as in the embodiments as shown in FIG. 1 and FIG. 9 in a compact system while relieving the load on design and production of the condenser lens 26.

What is claimed is:

1. A light exposure system for exposure of a pattern on a first object to form an image thereof on a second object, comprising:
    an illumination optical system for illuminating said first object;
    a projection optical system for projecting the pattern on said first object onto said second object;
    stage means for two-dimensionally moving said second object while holding said second object;
    a reference member mounted on said stage means;
    detecting means for detecting light from said reference member; and
    measuring means for carrying out a predetermined measurement, based on an output of said detecting means;
    wherein said illumination optical system comprises:
    light source means for supplying exposure light;
    off-center multiple beam producing means for producing from the exposure light from said light source means a plurality of light sources eccentric to an optical axis of said illumination optical system; and
    a light condensing optical system for condensing a plurality of beams from said off-center multiple beam producing means to illuminate said first object in an oblique direction; and
    wherein said detecting means being disposed at a position where said plurality of the light sources are formed by said off-center multiple beam producing means and on said optical axis of the illumination optical system, and receiving the light from said reference member through said projection optical system and said light condensing optical system.

2. A light exposure system according to claim 1, wherein said reference member has a reference mark formed in a predetermined pattern.

3. A light exposure system according to claim 2, further comprising:
    a light source unit for supplying light for illuminating said reference mark;
    light guide means for guiding the light from the said light source unit to the vicinity of said reference mark; and
    a condenser lens system for condensing light from said light guide means to illuminate said reference mark;
    wherein said detecting means receives the light from said reference mark through said projection optical system, a mark formed on said first object, and said light condensing optical system, and
    wherein said measuring means performs a measurement of a position of said first object with respect to said reference mark.

4. A light exposure system according to claim 3, wherein said off-center multiple beam producing means comprises four optical integrator means disposed eccentric to the optical axis of said illumination optical system.

5. A light exposure system according to claim 2, wherein said light source means comprises optical path switching means for selectively guiding light in either one direction of a first direction to said illumination optical system and a second direction different from the first direction;

wherein said light exposure system further comprises light guide means for guiding light guided by said optical path switching means in said second direction to the vicinity of said reference mark, and a condenser lens system for condensing light from said light guide means to illuminate said reference mark; and wherein said detecting means receives light from said reference mark through said projection optical system, a mark formed on said first object, and said light condensing optical system, and said measuring means performs a measurement of a position of said first object with reference to said reference mark.

6. A light exposure system according to claim 5, wherein said off-center multiple beam producing means comprises four optical integrator means disposed eccentric to the optical axis of said illumination optical system.

7. A light exposure system according to claim 2, wherein said off-center multiple beam producing means comprises a plurality of optical integrators disposed eccentric to the optical axis of said illumination optical system;

wherein said light exposure system further comprises shutter means for permitting one of beams from said optical integrators to pass through said light condensing optical system and said projection optical system to illuminate said reference mark; and wherein said measuring means measures a balance of quantity of light among beams illuminating said first object in the oblique direction, based on respective outputs of beams from said reference mark sequentially detected by said detecting means through the operation of said shutter means.

8. A light exposure system according to claim 7, further comprising correction means for correcting into an optimum condition a quantity of light in each of the beams illuminating said first object in the oblique direction, based on a measurement result obtained by said measuring means.

9. A light exposure system according to claim 7, wherein said off-center multiple beam producing means comprises four optical integrator means disposed eccentric to the optical axis of said illumination optical system.

10. A light exposure system for exposure of a pattern on a first object to form an image thereof through a projection optical system on a second object, comprising:

light source means for supplying exposure light;

first optical means for forming from the light from said light source means a plurality of beams eccentric to an optical axis of said projection optical system;

second optical means for forming from light from said first optical means a plurality of beams eccentric to the optical axis of said projection optical system;

a light condensing optical system for condensing light from said second optical means to illuminate said first object in an oblique direction;

light splitting means for splitting the plurality of beams for exposure formed by said first optical means and for splitting light from said second object through said projection optical system and said light condensing optical system;

first detecting means for detecting said exposure light split by said light splitting means;

second detecting means for detecting the light from said second object split by said light splitting means; and controlling means for controlling an imaging characteristic of said projection optical system, based on outputs of said first and second detecting means.

11. A light exposure system according to claim 10, wherein said light condensing optical system is located coaxial with said projection optical system, said first optical means has four first optical integrator means disposed eccentric to the optical axis of said light condensing optical system, said second optical means has four second optical integrator means disposed eccentric to the optical axis of said light condensing optical system, and said first optical integrator means and said second optical integrator means are disposed in parallel with the optical axis of said light condensing optical system.

12. A light exposure system according to claim 11, further comprising:

stage means for two-dimensionally moving said second object while holding said second object;

third detecting means disposed on said stage means, for detecting illumination light for illuminating said second object; and a reference reflection member disposed on said stage means, for reflecting the illumination light for illuminating said second object and for guiding reflected light thereof through said projection optical system and said light condensing optical system to said second detecting means;

wherein said controlling means controls the imaging characteristic of said projection optical system, based on an output related to the exposure light and obtained by said first detecting means, an output related to the reflected light from said second object and to the reflected light from said reference reflection member and obtained by said second detecting means, and an output related to the illumination light illuminating said second object and obtained from said third detecting means.

13. A light exposure system according to claim 12, wherein said third detecting means comprises a diffraction grating provided on said stage means and a detector for photoelectrically detecting light diffracted by said diffraction grating.

14. A light exposure system according to claim 11, wherein said light splitting means has four light splitting members disposed between the first optical integrator means and the second optical integrator means.

15. A light exposure system for exposure of a pattern on a first object to form an image thereof through a projection optical system on a second object, comprising:

light source means for supplying exposure light;

off-center multiple beam producing means for producing from the exposure light from said light source means a plurality of light sources eccentric to an optical axis of said projection optical system;

a light condensing optical system disposed coaxial with said projection optical system, for condensing light from said off-center multiple beam producing means to illuminate said first object in an oblique direction;

reflected light detecting means disposed at a position where the plurality of eccentric light sources are formed by said off-center multiple beam producing means and on the optical axis of said light condensing optical system, for detecting reflected light from said second object through said projection optical system and said light condensing optical system; and measuring means for performing a measurement relating to a reflectance of said second object, based on an output of said reflected light detecting means.

16. A light exposure system according to claim 15, wherein said off-center multiple beam producing means comprises four optical integrator means disposed eccentric to the optical axis of said light condensing optical system.

17. A light exposure system according to claim 15, wherein said off-center multiple beam producing means comprises:

first optical means comprising a plurality of optical integrators disposed eccentric to the optical axis of said light condensing optical system to form from the light from said optical means a plurality of light sources eccentric to the optical axis of said light condensing optical system; and second optical means comprising a plurality of optical integrators disposed eccentric to the optical axis of said light condensing optical system between said first optical means and said light condensing optical system to form from the light from said first optical means a plurality of beams eccentric to the optical axis of said light condensing optical system.

18. A light exposure system according to claim 17, further comprising:

light splitting means for splitting the plurality of beams for exposure formed by said first optical means;

exposure light detecting means for detecting said exposure light split by said light splitting means; and controlling means for controlling an imaging characteristic of said projection optical system, based on an output from said exposure light detecting means and an output from said measuring means.

19. A light exposure system according to claim 18, further comprising:

stage means for two-dimensionally moving said second object while holding said second object;

illumination light detecting means disposed on said stage means, for detecting the illumination light for illuminating said second object; and a reference reflection member disposed on said stage means, for reflecting the illumination light for illuminating said second object and for guiding reflected light thereof through said projection optical system and said light condensing optical system to said reflected light detecting means;

wherein said controlling means controls the imaging characteristic of said projection optical system, based on an output related to the exposure light and obtained by said exposure light detecting means, an output related to the reflected light from said second object and to the reflected light from said reference reflection member and obtained by said reflected light detecting means, and an output related to the illumination light illuminating said second object and obtained by said illumination light detecting means.

20. A light exposure system according to claim 19, wherein said third detecting means comprises a diffraction grating provided on said stage means and a detector for photoelectrically detecting light diffracted by said diffraction grating.

* * * * *